United States Patent
Yamazaki et al.

(10) Patent No.: US 6,274,887 B1
(45) Date of Patent: Aug. 14, 2001

(54) SEMICONDUCTOR DEVICE AND MANUFACTURING METHOD THEREFOR

(75) Inventors: Shunpei Yamazaki, Tokyo; Hisashi Ohtani; Toshiji Hamatani, both of Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/431,131

(22) Filed: Nov. 1, 1999

(30) Foreign Application Priority Data

| Nov. 2, 1998 | (JP) | 10-311633 |
| Nov. 10, 1998 | (JP) | 10-336561 |

(51) Int. Cl.$^7$ .................................................. H01L 29/04
(52) U.S. Cl. ........................... 257/72; 69/204; 69/274; 69/338; 69/368; 69/369
(58) Field of Search ............................ 257/72, 69, 204, 257/274, 338, 368, 369

(56) References Cited

U.S. PATENT DOCUMENTS

| 5,247,190 | 9/1993 | Friend et al. ............................ 257/40 |
| 5,399,502 | 3/1995 | Friend et al. ............................ 437/1 |
| 5,401,982 | 3/1995 | King et al. . | |

(List continued on next page.)

FOREIGN PATENT DOCUMENTS

| 7-130652 | 5/1995 | (JP) . |
| 8-078329 | 3/1996 | (JP) . |
| 10-92576 | 4/1998 | (JP) . |
| 10-135468 | 5/1998 | (JP) . |
| 10-135469 | 5/1998 | (JP) . |
| 10-247735 | 9/1998 | (JP) . |
| 10-270363 | 10/1998 | (JP) . |
| 10-294280 | 11/1998 | (JP) . |
| 11-191628 | 7/1999 | (JP) . |
| 11-345767 | 12/1999 | (JP) . |
| 11-354442 | 12/1999 | (JP) . |
| WO90/13148 | 11/1990 | (WO) . |

OTHER PUBLICATIONS

Ryuichi Shimokawa and Yutaka Hayashi, "Characterization of High–Efficiency Cast–Si Solar Cell Wafers by MBIC Measurement", Japanese Journal of Applied Physics, vol. 27, No. 5, May 1988, pp. 751–758.
Mutsuko Hatano, Hajime Akimoto, and Takeshi Sakai "A Novel Self–aligned Gate–overlapped LDD Poly–Si TFT with High Reliability and Performance", Central Research Laboratory, Hitachi, Ltd. Kokubunji, Tokyo, 185 Japan, IEDM 97–523–5926.
Hermann Schenk, Heinrich Becker et al., "Polymers for Light Emitting Diodes", EuroDisplay '99, The 19th International Display Research Conference, Sep. 6–9, 1999, Berlin, Germany, pp 33–37.
Hatano et al., "A Novel Self–aligned Gate–overlapped LDD Poly–Si TFT with High Reliability and Performance", Dec. 7–10, 1997, pp. 523–526, Internl. Elec. Devices Meeting 1997.
European Patent Office, European Search Report, May 9, 2000, (7 pages).

*Primary Examiner*—Eddie Lee
*Assistant Examiner*—Matthew E. Warren
(74) *Attorney, Agent, or Firm*—Eric J. Robinson; Nixon Peabody LLP

(57) ABSTRACT

An active layer of an NTFT includes a channel forming region, at least a first impurity region, at least a second impurity region and at least a third impurity region therein. Concentrations of an impurity in each of the first, second and third impurity regions increase as distances from the channel forming region become longer. The first impurity region is formed to be overlapped with a side wall. A gate overlapping structure can be realized with the side wall functioning as an electrode.

81 Claims, 27 Drawing Sheets

U.S. PATENT DOCUMENTS

| | | |
|---|---|---|
| 5,576,556 | 11/1996 | Takemura et al. . |
| 5,612,234 * | 3/1997 | Ha .......................................... 437/40 |
| 5,620,905 | 4/1997 | Konuma et al. . |
| 5,643,826 | 7/1997 | Ohtani et al. .......................... 437/88 |
| 5,710,606 | 1/1998 | Nakajima et al. . |
| 5,719,065 * | 2/1998 | Takemura et al. .................... 437/21 |
| 5,736,414 * | 4/1998 | Yamaguchi ............................ 437/21 |
| 5,789,762 | 8/1998 | Koyama et al. . |
| 5,923,962 | 7/1999 | Ohtani et al. ........................ 438/150 |
| 5,926,735 * | 7/1999 | Yamazaki et al. .................... 438/635 |
| 5,959,313 * | 9/1999 | Yamazaki et al. ..................... 257/59 |

* cited by examiner

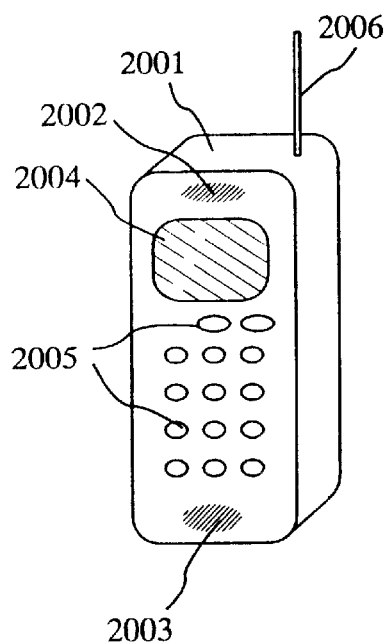
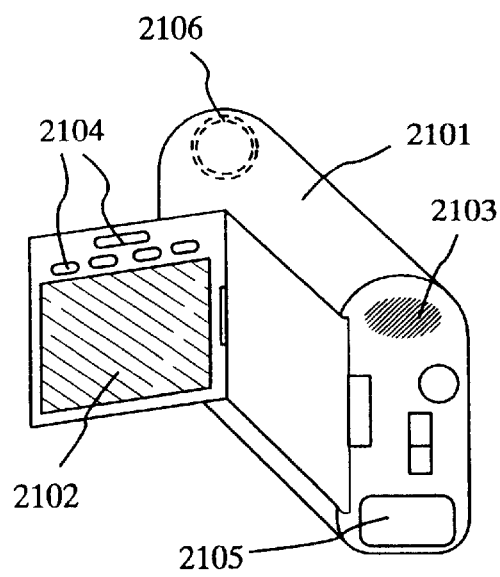
FIG. 13A
FIG. 13B
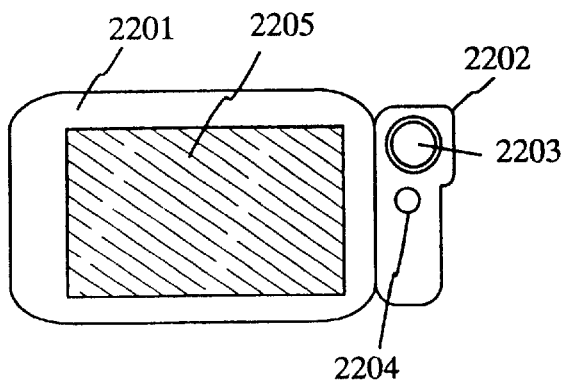
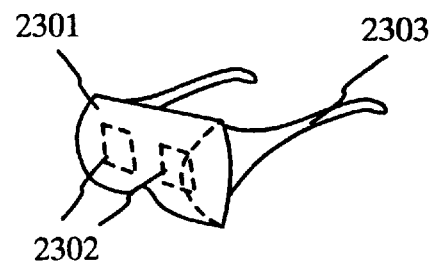
FIG. 13C
FIG. 13D

PIXEL TFT PORTION | CAPACITIVE SECTION

PIXEL TFT PORTION | CAPACITIVE SECTION

SEMICONDUCTOR DEVICE AND MANUFACTURING METHOD THEREFOR

BACKGROUND OF THE INVENTION

1. Field of the Invention

The present invention relates to a semiconductor device having circuits structured with thin film transistors (hereinafter referred to as TFT). For example, the present invention relates to electro-optical devices, typically liquid crystal display panels, and to the structure of electronic equipments loaded with such electro-optical devices as parts. Note that throughout this specification semiconductor device generally indicates devices that acquire their function through the use of semiconductor characteristics, and electro-optical devices, semiconductor circuits, as well as electronic equipments are semiconductor devices.

2. Description of the Related Art

Active matrix type liquid crystal display devices composed of TFT circuits that use polysilicon films have been in the spotlight in recent years. They are the backbone for realizing high definition image displays, in which a plurality of pixels are arranged in a matrix state, and the electric fields that occur in the liquid crystals are controlled in that matrix state.

With this active matrix type liquid crystal display device, as the resolution becomes high definition such as XGA and SXGA, the number of pixels exceeds one million. The driver circuit that drives all of the pixels is extremely complex, and furthermore is formed from a large number of TFTs.

The required specifications for actual liquid crystal display device (also called liquid crystal panels) are strict, and in order for all of the pixels to operate normally, high reliability must be secured for both the pixels and the driver circuit. If an abnormality occurs in the driver circuit, especially, this invites a fault called a line defect in which one column (or one row) of pixels turns completely off.

However, TFTs which use polysilicon films are still not equal to the MOSFETs (transistors formed on top of a single crystal semiconductor substrate), used in LSIs etc., from a reliability point of view. As long as this shortcoming is not overcome, such a view that it is difficult to use TFTs when forming an LSI circuit gets stronger.

The applicant of the present application considers that a MOSFET has three advantages from a reliability standpoint, and infers the reason thereof as follows. A schematic diagram of a MOSFET is shown in FIG. 2A. The MOSFET contains a drain region 201 formed on a single crystal silicon substrate, and an LDD (lightly doped drain) region 202. In addition, there is a field insulating film 203, and a gate insulating film 205 directly under a gate wiring 204.

In that arrangement, the applicant considered that there are three advantages from a reliability standpoint. The first advantage is an impurity concentration gradient seen when looking at the drain region 201 from the LDD region 202. As shown in FIG. 2B, the impurity concentration gradually becomes higher from the LDD region 202 toward the drain region 201 for a conventional MOSFET. This gradient is considered effective in improving reliability.

Next, the second advantage is that the LDD region 202 and the gate wiring 204 overlap. Known examples of this structure include GOLD (gate-drain overlapped LDD), LATID (large-tilt-angle implanted drain), etc. It becomes possible to reduce the impurity concentration in the LDD region 202, the relaxation effect of the electric field becomes larger, and the hot carrier tolerance increases.

Next, the third advantage is that a certain level of distance exists in between the LDD region 202 and the gate wiring 204. This is due to the field insulating film 203 being formed by a shape in which it is slipped under the gate wiring. Namely, a state in which only the overlapped portion of the thick film gate insulating film becomes thick, so an effective relaxation of the electric field can be expected.

A conventional MOSFET compared with a TFT in this way has several advantages, and as a result, is considered to possess a high reliability.

In addition, attempts have been made in which these MOSFET advantages are applied to a TFT. For example, Hatano et al (M. Hatano, H. Akimoto, and T. Sakai, IEDM97 Technical Digest, p. 523–526) realized a GOLD structure that uses sidewalls formed by silicon.

However, compared with a normal LDD structure, the structure published in the paper has a problem in that the off current (the current that flows when the TFT is in the off state) gets large, and therefore a countermeasure is necessary.

As described above, the applicant of the present invention considers that, when the TFT and the MOSFET are compared, the problems associated with a TFT structure affect its reliability (especially its hot carrier tolerance).

SUMMARY OF THE INVENTION

The present invention is technology for overcoming this type of problem, and therefore has an object of the invention to realize a TFT that boasts the same or higher reliability than a MOSFET. In addition, another object of the invention is to realize a semiconductor device with high reliability which includes semiconductor circuits formed by circuits using this type of TFTs.

An active layer of the NTFT of the present invention is firstly characterized by including three impurity regions, other than a channel forming region, which have at least three different impurity concentrations. With this, an LDD structure can be obtained, in which the impurity concentration becomes gradually higher away from the channel forming region (in proportion to the distance from the channel forming region). Namely, it is possible to increase the TFT's reliability by a relieved electric field at the drain edge (vicinity of the border between the drain and the channel forming region).

An aim of the inventor of the present invention is to intentionally form a plurality of regions with the concentration gradient of the LDD section of an exemplary, conventional MOSFET. Therefore, there is no problem with the existence of three or more impurity regions.

Further, a second characteristic of the present invention resides in that it is formed into a state in which the gate wiring (including the gate electrodes) covers (overlaps) at least a part of the LDD region, through the gate insulating film. Deterioration due to a hot carrier can also be effectively suppressed with this type of structure In addition, a third characteristic of the present invention is that, through the multiplier effect of the first characteristic and the second characteristic described above, the reliability of a TFT can be raised.

BRIEF DESCRIPTION OF THE DRAWINGS

FIGS. 13A to 13D are drawings showing electronic equipments of Embodiment 18;

DETAILED DESCRIPTION OF THE PREFERRED EMBODIMENTS

Figure 1:
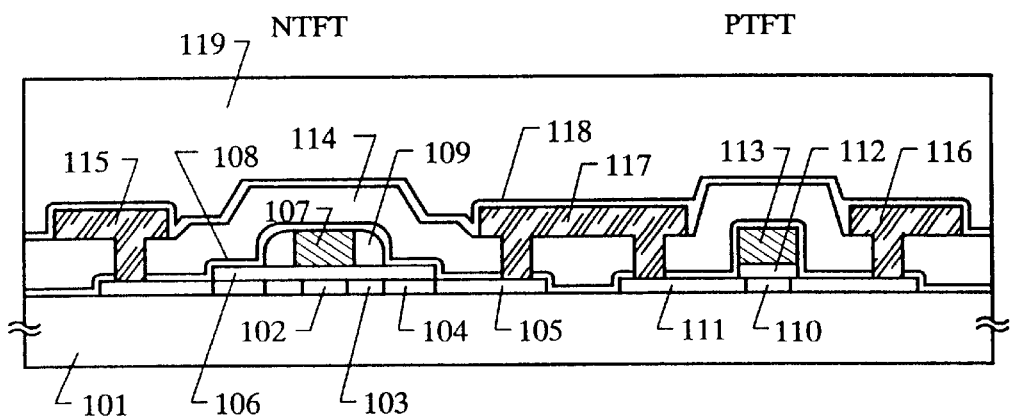
FIG. 1 is a drawing showing a cross section of a CMOS circuit of the present invention.
Figure 14:
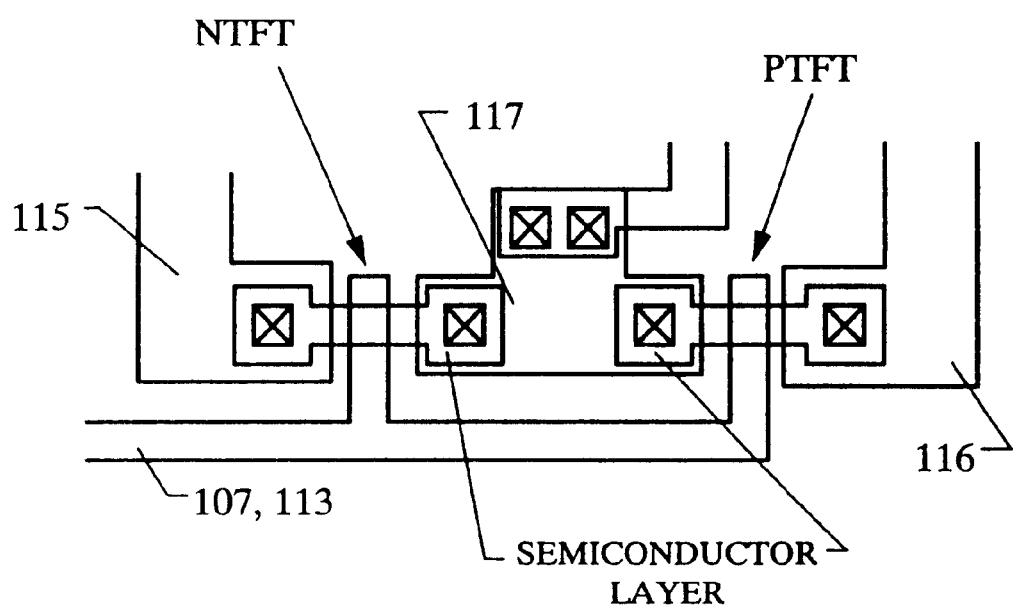
FIG. 14 is a drawing of a CMOS circuit viewed from a top surface of the present invention.

An embodiment mode of the present invention is explained with reference to FIG. 1. Note that a cross sectional view is shown in FIG. 1, and that a view looking from above is shown in FIG. 14. In FIG. 1, reference numeral 101 denotes a substrate having an insulating surface. It is possible to use, for example, a glass substrate with a prepared silicon oxide film, a quartz substrate, a stainless steel substrate, a metallic substrate, a ceramic substrate, or a silicon substrate.

A characteristic of the present invention resides in the structure of an active layer in an N-channel type TFT (hereafter referred to as NTFT). An NTFT active layer is formed by including a channel forming region 102, a pair of first impurity regions 103, a pair of second impurity regions pair 104, and a pair of third impurity regions 105. Note that the impurities doped into each of the impurity regions are elements belonging to the group 15 of the periodic table (typically phosphorous and arsenic).

The channel forming region 102 at this time is either an intrinsic semiconductor layer, or a semiconductor layer which has been doped with boron to a concentration of $1 \times 10^{16}$ to $5 \times 10^{18}$ atoms/cm$^3$. Boron is an impurity used to control the threshold voltage and to prevent punch-through, but other elements can be substituted if the similar effects may be provided. The doping concentration in that case is similar to the level for boron.

Note that the semiconductor layers that can be used by the present invention include not only semiconductors with silicon as their main component, such as silicon, germanium, and silicon germanium. Chemical compound semiconductor layer such as gallium arsenide can also be used. In addition, the present invention is applicable to TFTs that use amorphous semiconductors (amorphous silicon etc.) as the active layer, as well as to TFTs that use semiconductors that include crystals (including single crystal semiconductor thin films, polycrystalline semiconductor thin films, microcrystalline thin films).

Further, each of the first impurity regions 103 on the NTFT has a length of between 0.1 to 1 $\mu$m (typically between 0.1 to 0.5 $\mu$m, preferably between 0.1 to 0.2 $\mu$m), and includes a concentration of a periodic table group 15 element (phosphorous is typical) in the range of $1 \times 10^{15}$ to $1 \times 10^{17}$ atoms/cm$^3$ (typically between $5 \times 10^{15}$ to $5 \times 10^{16}$, preferably between $1 \times 10^{16}$ to $2 \times 10^{16}$ atoms/cm$^3$). Note that this impurity concentration is denoted as "n$^-$"(the "n$^-$" region refers to the first impurity regions 103 in this specification).

Also note that throughout this specification, unless otherwise particularly specified, "impurity" is used to specify either a periodic table group 13 element or group 15 element.

Each of the second impurity regions 104 has a length of between 0.5 to 2 $\mu$m (typically between 1 to 1.5 $\mu$m), and includes a concentration of a periodic table group 15 element in the range of $1 \times 10^{16}$ to $1 \times 10^{19}$ atoms/cm$^3$ (typically between $1 \times 10^{17}$ to $5 \times 10^{18}$ atoms/cm$^3$, preferably between $5 \times 10^{17}$ to $1 \times 10^{18}$ atoms/cm$^3$). It is desirable to regulate the impurity concentration in the second impurity region 104 to between 5 to 10 times the impurity concentration of the first impurity regions 103. Note that this impurity concentration is denoted as "n" (the "n" region refers to the second impurity regions 104 in this specification).

Further, each of the third impurity regions 105 has a length of between 2 to 20 $\mu$m (typically between 3 to 10 $\mu$m), and includes a concentration of a periodic table group 15 element in the range of $1 \times 10^{19}$ to $1 \times 10^{21}$ atoms/cm$^3$ (typically between $1 \times 10^{20}$ to $5 \times 10^{20}$ atoms/cm$^3$). Each of the third impurity regions 105 becomes a source region or a drain region which provides an electrical connection between the source wiring, or the drain wiring, and the TFT. Note that this impurity concentration is denoted as "n+"(the "n+" region refers to the second impurity regions 105 in this specification).

In addition, in the present invention, each of the third impurity regions 105 plays a very important role for gettering, from the inside of the channel forming region 102, the catalytic element used in crystallization of the channel forming region. The effect thereof will now be briefly explained.

In the present invention, a catalytic element for promoting the crystallization (typically nickel) can be used during crystallization of an amorphous semiconductor film. However, nickel is a metallic element, so it may be the cause of a leak current if any remains in the channel forming region. In other words, it is desirable to provide a process in which the catalytic element is at least removed from the channel forming region after the catalytic element has been used.

The present invention is characterized in that a periodic table group 15 element (preferably phosphorous) is used in the source region and the drain region in order to remove the catalytic element. Namely, by conducting a heat treatment after forming the source region and the drain region (the third impurity regions 105), the nickel that remains inside the channel forming region 102 is gettered (captured) into the third impurity regions 105. Thus, the catalytic element used for crystallization can be removed from inside the channel forming region 102.

Therefore, the gettered catalytic element collects in the third impurity regions 105, where it exists at high concentration. The present applicant investigated this by SIMS (secondary ion mass spectroscopy), and found that the concentration of the catalytic element to be between $1 \times 10^{17}$ to $1 \times 10^{20}$ atoms/cm$^3$ (typically between $1 \times 10^{18}$ to $5 \times 10^{19}$ atoms/cm$^3$). However, the third impurity regions 105 may only perform the function as an electrode, so that the existence of a large amount of the catalytic element will not generate any problems.

On the other hand, the concentration of the catalytic element in the channel forming region 102 is greatly reduced (or eliminated) by gettering action. The present inventor investigated by SIMS and found that the concentration of the catalytic element had been reduced to $2 \times 10^{17}$ atoms/cm$^3$ or less (typically, between $1 \times 10^{14}$ to $5 \times 10^{16}$ atoms/cm$^3$) in the channel forming region. (Strictly speaking, a pad was formed to have a composition identical to that of the channel forming region 102, and then measured by SIMS). Thus, a characteristic of the present invention resides in that there is a large difference in the catalytic element concentration depending upon their positions (a difference of 100 to 1,000 times) even within the same active layer.

The active layer of the NTFT according to the present invention, as described above, is characterized in that it includes at least three impurity regions that include the same impurity with different concentrations other than the channel forming region. With employing such a structure, an arrangement can be realized in which the impurity concentration (a periodic table group 15 element) gradually increases as the distance from the channel forming region 102 to each of the first impurity regions 103, the second impurity regions 104, and the third impurity regions 105 becomes long (in proportion to the distance from the channel forming region 102).

Further, since the object of the invention is to intentionally form a concentration gradient like that seen in the LDD section of the conventional MOSFET example, by using a plurality of impurity regions, there is no problem if more than three impurity regions exist.

A gate insulating film 106 is formed on the active layer thus formed. The gate insulating film 106 is formed so that it overlaps the second impurity regions 104 for the case in FIG. 1. This is a unique process structure when forming the second impurity regions 104, which becomes a characteristic when the present invention is embodied. The gate insulating film 106 is formed so as to be brought into contact with the channel forming region 102, the first impurity regions 103, and the second impurity regions 104.

A gate wiring 107 is further formed on the gate insulating film 106. As the material for the gate wiring 107, a single metallic layer, an alloy layer, or a laminate structure of these combination may be employed such as tantalum (Ta); tantalum nitrite (TaN); titanium (Ti); chromium (Cr); tungsten (W); molybdenum (Mo); silicon (Si); aluminum (Al); or Copper (Cu).

Typical examples of the laminate structure include the structures comprising: Ta/Al; Ta/Ti; Cu/W; and Al/W. In addition, metallic silicide structures (specifically, structures given conductivity with a combination of silicon and a metallic silicide such as Si/WSix, Si/TiSix, Si/CoSix, and Si/MoSix) may be employed.

However, when forming sidewalls made of silicon, it is preferred to place a material on the top surface thereof with a high selective etching ratio compared to silicon. This is used to prevent etching all the way to the gate wiring when forming the sidewalls. Otherwise, it is necessary to use a protective film on the top surface as a stopper for protection when forming the sidewalls.

Further, though it will be described later, a PTFT structure prepared with no sidewall for the CMOS circuit of the present invention is effective. Therefore, since a later step for removing only the sidewalls is included, it is necessary to choose a material for the gate wiring that is not etched during removal of the sidewalls. In the paper described as the conventional example, it has a structure with a silicon gate directly contacting silicon sidewalls, it is not possible to realize the CMOS circuit of the present invention by using that structure as it is.

Further, when performing a heat treatment for the gettering process described above, it is necessary to pay attention to the thermal resistance etc. of the gate wiring 107 (or a gate wiring 113). A restriction on the temperature of the heat treatment arises if a low melting point metal such as aluminum is included. In addition, tantalum oxidizes very easily, and it is necessary to provide a protective film of silicon nitride etc., so that the tantalum is not exposed to the environment of the heat treatment.

A silicon nitride film 108 shown in FIG. 1 is a protective film provided for that reason. It is effective to dope a fine amount of boron into the silicon nitride film 108, because this increases the thermal conductivity and can provide a radiating effect.

Sidewalls 109 are formed in the sidewalls (side portions) of the gate wiring 107. A layer with silicon as its main component is used as the sidewalls 109 for the present invention (specifically, a silicon layer or a silicon germanium layer). Especially, the use of intrinsic silicon, is desirable. Of course, an amorphous, crystalline, or microcrystalline structure may be used.

The present invention takes a structure in which the sidewalls 109 overlap on the first impurity regions 103 (the first impurity regions 103 and the sidewalls 109 overlap through the gate insulating film 106). With this structure, advantages similar to the GOLD structure or the LATID structure of a MOSFET can be obtained.

Further, in order to realize this type of structure, it is necessary to have a structure in which a voltage is applied to the first impurity regions 103 by the sidewalls 109. If the sidewalls 109 are formed of intrinsic silicon layer, the resistance is high but a leak current is generated, so that there is a benefit in that the sidewall portion does not form a capacitor. Namely, it is possible to prevent a dielectric storage capacity from being formed in the sidewalls when the gate voltage is turned off.

In addition, the active layer film thickness becomes thin for the case of a TFT, in the range of 20 to 50 nm, and during operation the depletion layer expands completely to the lower part of the active layer, and the TFT becomes a fully depression type (FD type). By making the FD type TFT into an overlapping gate type, an electric field is formed in the direction in which a hot carrier is difficult to generate. On the contrary, by using a general offset structure with an FD type TFT, there is the fear that an electric field will be formed in a direction that promotes hot carrier injection.

The NTFT of the present invention can achieve a high reliability that is equal to, or greater than, that of a MOSFET by using a structure like the one described above. Further, by applying a gate voltage to the first impurity regions 103 by using the sidewalls 109, it is possible to achieve an effect that is similar to that of an overlap structure.

Next, by arranging each of the first impurity regions 103, each of the second impurity regions 104, and each of the third impurity regions 105 in the stated order, a structure can be realized in which the impurity concentration gradually becomes higher from the channel forming region 102 toward the source region (or drain region). With employing this structure, it is possible to effectively control the TFT off current.

Figure 2A:
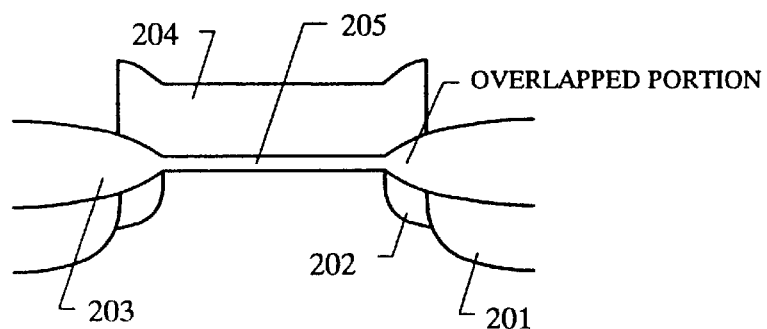
FIGS. 2A and 2B are drawings showing the structure of a cross section of a conventional MOSFET.
Figure 2B:
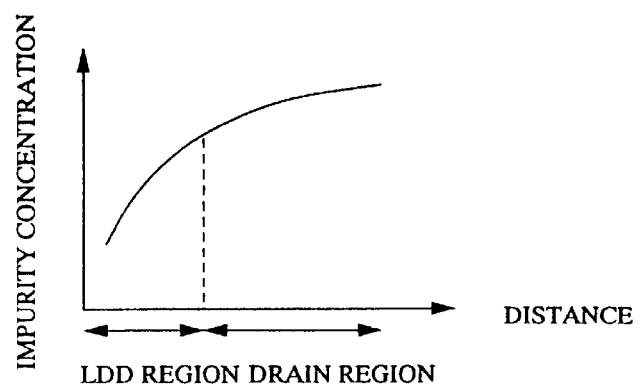

In addition, the second impurity region 104 is set some distance apart from the gate voltage, so that an electric field relaxation effect, similar to that of the overlap portion of the MOSFET shown in FIG. 2A, can be obtained. Further, the hot carrier that is generated by the first impurity regions 103 is injected straight up toward the sidewalls 109, so a trap state is not formed directly above the channel forming region 102. The NTFT of the present invention is explained above, however a p-channel type TFT (hereinafter referred to as PTFT) is basically a structure in which an LDD region and an offset region are not provided. Of course, it may employs a structure in which an LDD region and an offset region are arranged, however PTFTs have always had high reliability, so that it is desirable to gain the on current and balance the characteristics with the NTFT. As shown in FIG. 1, this balance of characteristics is especially important for applying the present invention to a CMOS circuit. However, it may apply the structure of the present invention to a PTFT.

The active layer of a PTFT in FIG. 1 possesses a channel forming region 110 and a pair of fourth impurity regions 111, which become the source region (or the drain region). Note that the impurity concentration (an element from periodic table group 13, boron is typical) is denoted as "p$^{++}$" (the fourth impurity regions 111 are referred to as "p$^{++}$" throughout this specification).

The fourth impurity regions 111 invert to p-type due to the periodic table group 13 element, but if a periodic table group 15 element is doped to the same concentration as in the third impurity regions 105 at a previous step, a sufficient gettering effect will be shown.

Therefore, catalytic element used for crystallization also exist in the fourth impurity regions 111 at a concentration of $1 \times 10^{17}$ to $1 \times 10^{20}$ atoms/cm$^3$ (typically, $1 \times 10^{18}$ to $5 \times 10^{19}$ atoms/cm$^3$) for this case. Since the fourth impurity regions 111 may only perform the function as an electrode, there is no problem if the catalytic element is present in large amounts. Of course the catalytic element concentration in the channel forming region 110 is 1/100 to 1/1000 times that in the fourth impurity regions 111, so the concentration is $2 \times 10^{17}$ atoms/cm$^3$ or less ($1 \times 10^{14}$ to $5 \times 10^{16}$ atoms/cm$^3$ is typical).

In addition, a gate insulating film 112 is formed in a self-aligning manner using the gate wiring 113 as a mask. As the characteristics of the process of the present invention, there are enumerated such facts that the sidewalls 109 are present in the NTFT, and the sidewalls are removed and do not remain in the PTFT.

The NTFT and PTFT formed in this manner are then covered by the first insulating films 114 (which also may be referred to as first interlayer insulating films), and source wirings 115 and 116, and a drain wiring 117 are formed. After forming these wirings in the structure of FIG. 1, a silicon nitride layer 118 is formed as a protective film to thereby increase the passivation effect. A second insulating layer 119 is formed out of a resin material on the silicon nitride layer 118. It is not necessary to place restrictions to the use of a resin material, however using a resin material is effective in maintaining flatness. Note that for a case in which another film is formed on the second insulating film 119, it is acceptable to denote the second insulating film 119 by "second inter layer insulating film."

A CMOS circuit in which an NTFT and a PTFT are combined in a complimentary manner has been explained thus far, however it is possible to apply the present invention to an NMOS circuit using an NTFT and to a pixel TFT formed from NTFTs. Of course, it can also be applied to a complex semiconductor circuit in which a CMOS circuit is taken as a basic unit.

In addition, the most characteristic point of the present invention resides in that it is formed in several stages so that the impurity concentration in the LDD region of an NTFT increases as a distance from the channel forming region increases. Furthermore, the catalytic element (an element used during crystallization) inside the channel forming region is reduced to a level in which it does not hinder the electrical characteristics of the TFT.

Thus it is not necessary to place limits on the TFT structure provided that this structure is included, and the present invention can be applied to a top gate structure (a planer structure is typical) and to a bottom gate structure (an inverted stagger structure is typical).

(Advantages of the NTFT structure of the present invention)

The advantages of the NTFT structure of the present invention are now discussed. The present invention's NTFT structure is characterized by a multiply-formed LDD region, from the first impurity regions 103 (the 1st LDD regions) and the second impurity regions 104 (the 2nd LDD regions), ones of which are overlapped by a gate electrode.

Figure 19A:
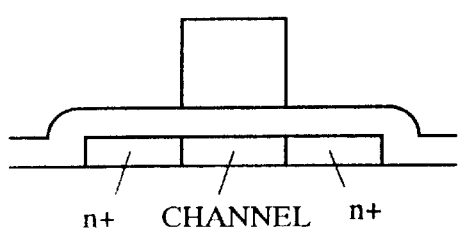
FIGS. 19A to 19H are drawings for comparing several types of TFT structures of the present invention.
Figure 19B:
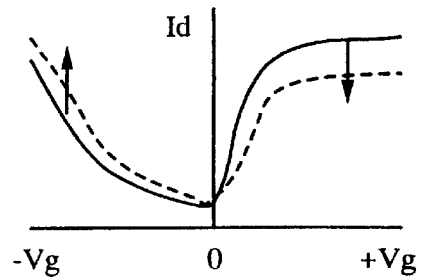
Figure 19C:
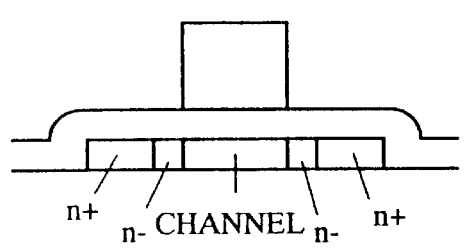
Figure 19D:
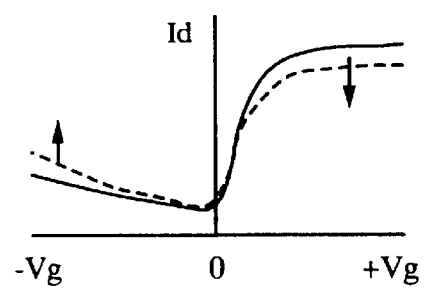

The superiority of the present invention will be explained by using a comparison with a conventional structure. FIGS. 19A and 19B show an NTFT with no LDD structure and its electrical characteristics (characteristic gate voltage Vg vs. drain current Id), respectively. The same is shown in FIGS. 19C and 19D for the case of a normal LDD structure, in FIGS. 19E and 19F for the so-called GOLD structure, and in FIGS. 19G and 19H for the NTFT of the present invention.

Note that throughout the figures, "n$^+$" denotes the source region or the drain region, channel denotes the channel forming region, and "n$^-$" denotes the LDD region ("n" denotes the second LDD region). Further, "Id" is the drain current, and "Vg" is the gate voltage.

The off current is high if there is no LDD structure, as shown in FIGS. 19A and 19B, and the on current (the drain current when the TFT is in an on state) and off current easily degrade.

Next, for the case with an LDD structure, the off current is considerably suppressed, and the degradation of the on current and the off current can be suppressed. However, the degradation of the on current cannot be completely suppressed.

Then, the structure in which the LDD region and the gate electrode overlap (FIGS. 19C and 19D) is a structure that places great importance on suppressing the degradation of the on current found in a conventional LDD structure.

While the on current degradation can be sufficiently suppressed for this case, it has the problem of the off current being somewhat higher than in a normal LDD. This structure is employed by Hatano et al. in their paper which is the conventional example, but the high off current problem is recognized for the present invention, and a structure to solve the problem is searched out.

Figure 19E:
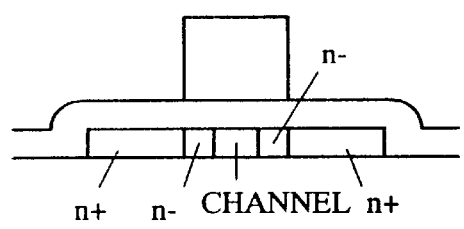
Figure 19F:
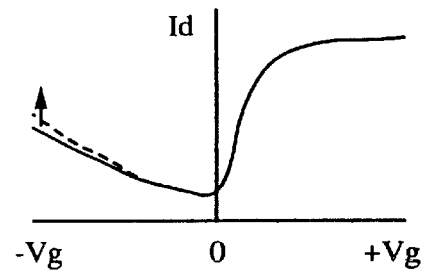
Figure 19G:
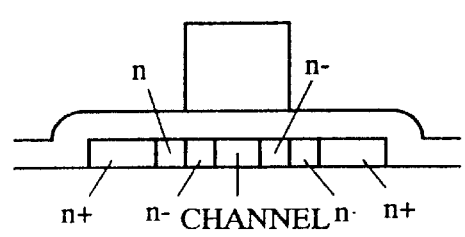
Figure 19H:
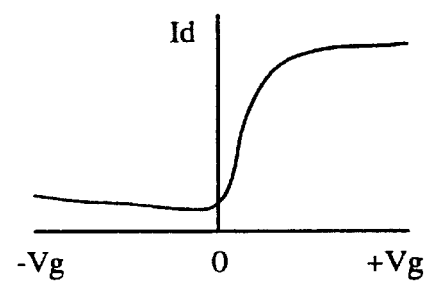

For the structure of the present invention, as shown in FIGS. 19G and 19H, the inner LDD region (the side closer to the channel forming region) overlaps the gate electrode, while the outer LDD region is formed so as not to overlap the gate electrode. By employing this structure, it is possible to reduce the off current while maintaining the effect that suppresses the on current degradation.

To the question of why does the off current get large in the structure shown in FIGS. 19E and 19F, the present inventor surmises the following. This explanation is made using FIGS. 20A and 20B.

When the NTFT is in an off state, a negative voltage of several dozen volts is applied to a gate electrode 41. In this state, if a positive voltage of several dozen volts is placed on a drain region 42, a very large electric field is formed at the edge portion on the drain side of a gate insulating film 43.

Figure 20A:
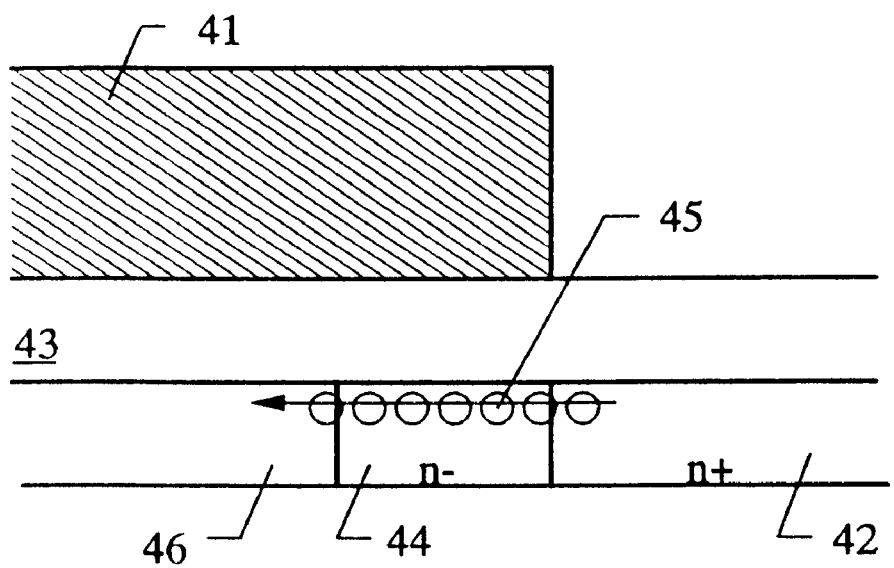
FIGS. 20A and 20B are drawings showing the energy bands for an NTFT (off-state) of the present invention.
Figure 20B:
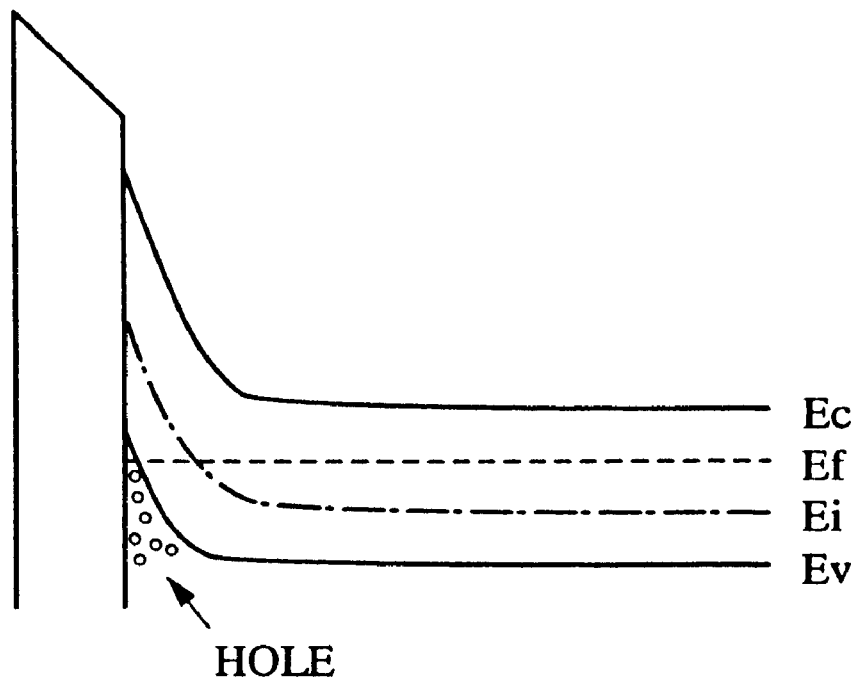

At this time, holes 45 which are minority carriers are induced in an LDD region 44, as shown in FIG. 20A. An energy band diagram is shown in FIG. 20B for this time. Namely, the minority carriers form a current path that connects the drain region 42, the LDD region 44, and a channel forming region 46. This current path is considered to bring about an increase in the off current.

In order to interrupt this current path along the way, the present applicant considers that it is necessary to form a separate resistive member in the location where the gate electrode is not overlapped, in other words a second LDD region. The structure of the present invention hit upon in this way.

The structure of the present invention outlined above is explained in detail by the embodiments shown below.

[Embodiment 1]

In embodiment 1, the manufacturing method of the CMOS circuit shown in FIG. 1 is explained using FIGS. 3A to 3E, FIGS. 4A to 4D, and FIGS. 5A–5B.

First, a 200 nm silicon oxide film 302 that becomes a base film is formed on a glass substrate 301. It may laminate a silicon nitride film onto the base film, and may use only a silicon nitride film. Plasma CVD, thermal CVD, or sputtering may be used as a film deposition method. Of course, doping boron into the silicon nitride film is effective to increase the radiation effect.

Next, a 50 nm amorphous silicon film is formed by plasma CVD, thermal CVD, or sputtering, on the silicon oxide film 302. Crystallization of the amorphous silicon film is carried out afterward by using the technique disclosed in Japanese Patent Application Laid-open No. Hei 7-130652, forming a semiconductor film containing crystals. This process is explained using FIGS. 5A and 5B.

First, a silicon oxide film 502 is formed as a base film on a glass substrate 501, and an amorphous silicon film 503 is formed thereon. Film deposition of the silicon oxide film 502 and the amorphous silicon film 503 is performed successively by sputtering in embodiment 1. Next, a 10 ppm nickel by weight of nickel acetate salt solution is applied, forming a nickel containing layer 504. (See FIG. 5A.)

Note that it is acceptable to use any of the following elements, either singly or in combination, instead of nickel (Ni): germanium (Ge); iron (Fe); palladium (Pd); tin (Sn); lead (Pb); cobalt (Co); platinum (Pt); copper (Cu); gold (Au); and silicon (Si).

Next, after a dehydrogenating process at 500° C. for 1 hour, a heat treatment is performed at a range between 500 and 650° C. for 4 to 24 hours (at 550° C. for 14 hours in embodiment 1), forming a polysilicon film 505. The polysilicon film 505 formed in this way is known to possess outstanding crystalline characteristics. (See FIG. 5B.)

However, a high concentration of nickel used for crystallization exists inside the polysilicon film 505 at this point. It is experimentally verified that a nickel with a concentration from $1 \times 10^{18}$ to $1 \times 10^{19}$ atoms/cm$^3$ at the minimum value of the measurement value by SIMS (secondary ion mass spectroscopy) remains. This nickel easily silicifies inside the channel forming region, and there is a concern that it will function as a low resistance current path (leak current flow path).

Note that the present applicant has investigated the electric characteristics of an actual TFT and was able to confirm that a nickel concentration at this level causes no remarkable bad influence on the electrical characteristics of the TFT. However, so long as there is only a chance of a bad influence, it is desirable to remove the nickel from at least the channel forming region. A gettering process for this purpose is explained below.

Figure 3A:
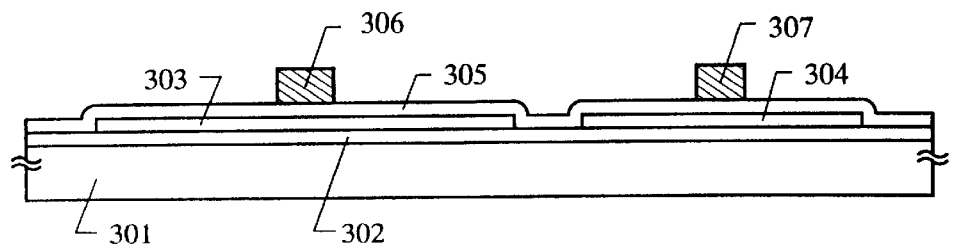
FIGS. 3A to 3E are drawings showing the manufacturing step of a CMOS circuit of Embodiment 1.

After forming the polysilicon film 505 in this manner, it is patterned into an island shape and active layers 303 and 304 are formed as shown in FIG. 3A.

Note that it is acceptable to irradiate the silicon film 505 with excimer laser light after it is formed. This may further be performed after forming the active layers 303 and 304. Any well-known method may be used for the excimer laser irradiation process, so its explanation is omitted here.

Next, a gate insulating film 305 is formed from an silicon oxide nitride film (expressed by SiOxNy) over the active layers 303 and 304, and gate wirings (including gate electrodes) 306 and 307 with a laminate structure of tantalum and tantalum nitride are formed thereon. (See FIG. 3A.)

The gate insulating film 305 has a thickness of 120 nm. Of course, a silicon oxide film or a laminate structure of silicon oxide and silicon nitride films may be used instead of the silicon oxide nitride film. In addition, it is possible to use another metal for the gate wirings 306 and 307, however a material with a high selective etching ratio to silicon is desirable in view of later processes.

A first phosphorous doping process (a process of doping with phosphorus) is performed after obtaining the conditions of FIG. 3A. The acceleration voltage is set high to 80 KeV because the doping must be performed through the gate insulating film 305 here. Further, the length (width) of first impurity regions 308 and 309 formed in this way is regulated to 0.5 μm, and the phosphorous concentration is regulated to $1\times10^{17}$ atoms/cm$^3$. Note that arsenic may be used as a substitute for phosphorous.

Also, the first impurity regions 308 and 309 are formed by using the gate wirings 306 and 307 as masks in a self-aligning manner. At this point an intrinsic polysilicon layer remains directly under the gate wirings 306 and 307, where channel forming regions 310 and 311 are formed. However, in practice, some amount will wrap around the inside of the gate wiring and be doped, resulting in a structure in which the gate wirings 306 and 307, and the first impurity regions 308 and 309 overlap. (See FIG. 3B.)

Next, an amorphous silicon film with a thickness from 0.1 to 1 μm (Typically, 0.2 to 0.3 μm) is formed so as to cover the gate wirings 306 and 307, and sidewalls 312 and 313 are formed by anisotropic etching using a chlorine gas. The width of the sidewalls 312 and 313 (the thickness viewed from the side portion of the gate wiring) is set as 0.2 μm. (See FIG. 3C.)

Note that an amorphous silicon layer with no doped impurities is used in embodiment 1, so that the sidewalls are formed from an intrinsic silicon layer (undoped silicon layer).

Figure 3B:
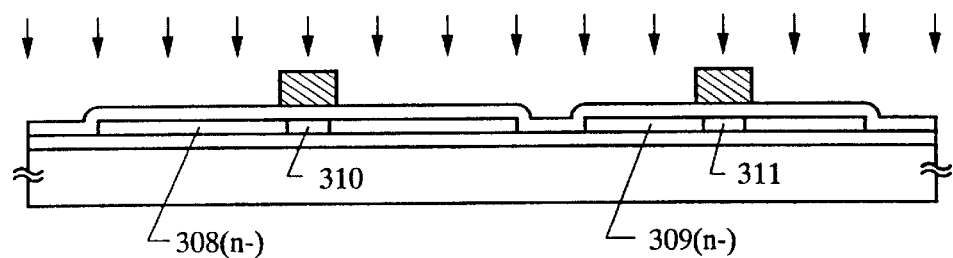
Figure 3C:
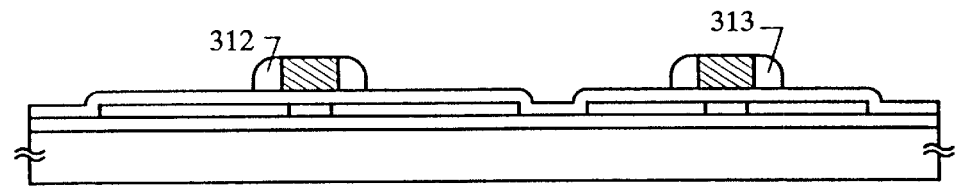

After the conditions in FIG. 3C are obtained, a second phosphorous doping process is performed. The acceleration voltage is set at 80 KeV in this case, the same as for the first doping process. Further, the dose is regulated so that the phosphorous concentration is $1\times10^{18}$ atoms/cm$^3$ in second impurity regions 314 and 315 formed at this time.

Figure 3D:
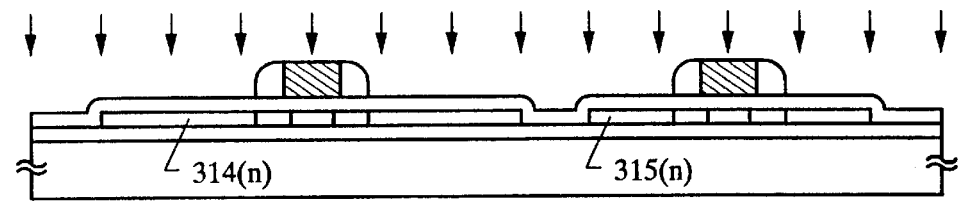

Note that the first impurity regions 308 and 309 remain only directly under the sidewalls 312 and 313 in the phosphorous doping process shown in FIG. 3D. Namely, this process defines the first impurity region 103 shown in FIG. 1. The first impurity region 308 functions as the 1st LDD region of the NTFT.

Phosphorous is also doped into the sidewalls 312 and 313 in the process of FIG. 3D. In practice, the acceleration voltage is high, so that the phosphorous distribution is known to be in a state where the tail end (hem) of the phosphorous concentration profile extends to the inside portion of the sidewalls 312 and 313. Although the resistive component of the sidewalls can be regulated by this phosphorous, if the phosphorous concentration distribution shows extreme dispersion, this may cause the gate voltage applied to the first impurity region 308 to fluctuate element by element. Therefore, precise control is necessary when doping.

Next, a resist mask 316 is formed covering a portion of the NTFT. The sidewall 313 on the PTTF is first removed, and a part of the gate insulating film 305 is then dry etched, forming processed gate insulating films 317 and 318. (See FIG. 3E.)

At this point, the length of the portion of the gate insulating film 317 projecting outwardly beyond the sidewall 312 (the length of the portion of gate insulating film 317 contacting a second impurity region 314) determines by the length (width) of the second impurity region 104 shown in FIG. 1. Conventionally, however, there has been a single LDD region, so dispersion in the width had a large influence on the electrical characteristics. Even if there is some dispersion in the width of the second impurity region 314, however, this will not become a problem because there are substantially two kinds of LDD regions in the case of embodiment 1.

On the other hand, the gate insulating film 318 is formed in a self-aligning manner using the gate wiring 307 as a mask. Consequently, the first impurity region 309 and the second impurity region 315 have exposed shapes.

Figure 3E:
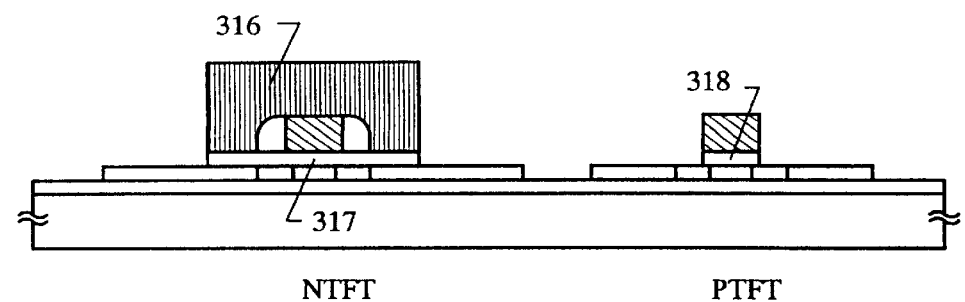

After the state in FIG. 3E is obtained, a third phosphorous doping process is performed. The acceleration voltage is set low at 10 KeV because the exposed active layer is doped with phosphorous this time. Note that in embodiment 1, the dose is regulated so that a phosphorous with a concentration of $5\times10^{20}$ atoms/cm$^3$ is contained in third impurity regions 319 and 320. (See FIG. 4A.)

The portion shielded by the resist mask 316 (the NTFT side) in this process is not doped with phosphorous, so that the second impurity region 314 remains as is in that section. Namely, this process defines the second impurity region 104 shown in FIG. 1, and at the same time defines the third impurity region 105 shown in FIG. 1. The second impurity region 104 functions as the 2nd LDD region, and the third impurity region 105 functions as the source region or the drain region.

In addition, since phosphorous is doped in the active layer that becomes the PTFT with the gate wiring 307 as a mask, a third impurity region 320 is formed in a self-aligning manner. At this point the phosphorous dose is 5 to 10 times higher than the above-mentioned second phosphorous dose, so the first impurity region ("n$^-$" region) and the second impurity region ("n" region) are essentially the same as the third impurity region ("n$^+$" region).

Note that it is desirable to regulate the phosphorous dopant amount so that a concentration in the third impurity regions 319 and 320 is at least $1\times10^{19}$ atoms/cm$^3$ or greater (preferably, between $1\times10^{20}$ and $5\times10^{21}$ atoms/cm$^3$) in embodiment 1. With a concentration lower than this, there is a fear that one cannot expect effective phosphorous gettering.

Next, the resist mask 316 is removed, and a resist mask 321 is newly formed to cover the NTFT. Then a boron doping process (a process of doping with boron) is performed. The acceleration voltage is set to 10 KeV here, and the dose is regulated so that a boron concentration of $3\times10^{21}$ atoms/cm$^3$ is contained in a formed fourth impurity region 322. The boron concentration at this time is denoted as "p$^{++}$". (See FIG. 4B.)

The third impurity region 320 (n$^+$) formed on the PTFT side is inverted by boron in this process, becoming p-type. Therefore, phosphorous and boron are mixed in the fourth impurity region 322. Further, the portion formed which wraps around the inside of the gate wiring 307 is also inverted into p-type by boron wrap around.

This defines the fourth impurity region 111 shown in FIG. 1. The fourth impurity region 322 is formed in a self-aligning manner using the gate wiring 307 as a mask, and functions as the source region or the drain region. In embodiment 1, neither the LDD region nor the offset region are formed for the PTFT, but there is no problem because PTFTs inherently have high reliability. On the contrary, one can gain the on current by not forming an LDD region etc., so there are cases when it is convenient not to do so.

Figure 4A:
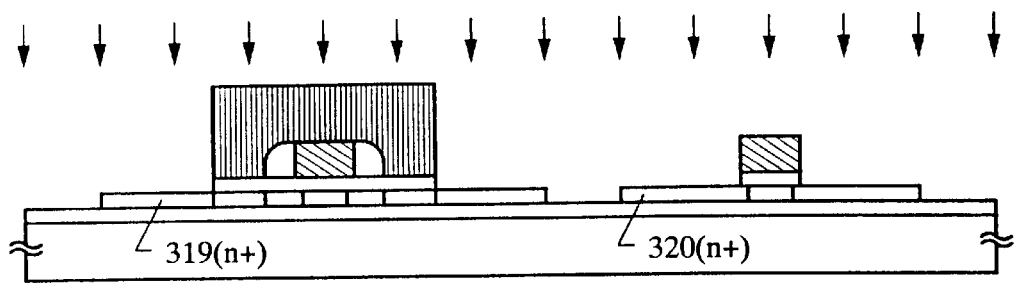
FIGS. 4A to 4D are drawings showing the manufacturing step of the CMOS circuit of Embodiment 1.
Figure 4B:
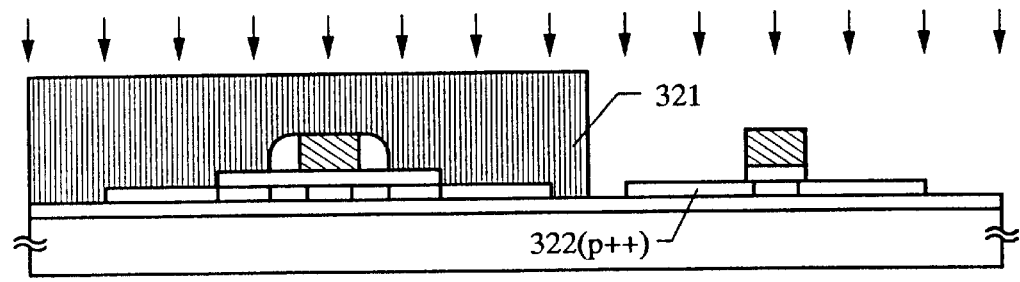

This leads finally to an NTFT active layer in which a channel forming region, a first impurity region, a second impurity region, and a third impurity region are formed, and to a PTFT active layer in which a channel forming region and a fourth impurity region are formed, as shown in FIG. 4B.

The resist mask 321 is removed after obtaining the conditions of FIG. 4B, and then a silicon nitride film 323 is formed as a protective film. The silicon nitride film 323 has a film thickness of from 1 to 100 nm (typically from 5 to 50 nm, preferably, from 10 to 30 nm).

Next, an annealing process is carried out at a processing temperature between 500 and 650° C. (typically between 550 and 600° C.) for 2 to 24 hours (typically from 4 to 12 hours). The annealing process is performed in a nitrogen atmosphere at 600° C. for 12 hours in embodiment 1. (See FIG. 4C.)

The annealing process is performed with the objective of activating the doped impurities (phosphorous and boron) in the first impurity region 308, the second impurity region 314, the third impurity region 319, and the fourth impurity region 322, and at the same time gettering the nickel remaining in the channel forming regions 310 and 311.

The phosphorous doped into the third impurity region 319 and the fourth impurity region 322 getters the nickel in the annealing process. Namely, the nickel is captured by migrating in the direction of the arrow and combining with phosphorous. Thus, nickel gathers in high concentration in a third impurity region 324 and a fourth impurity region 325 shown in FIG. 4C. Specifically, nickel is present in both impurity regions at a concentration of from $1 \times 10^{17}$ to $1 \times 10^{20}$ atoms/cm$^3$ (typically from $1 \times 10^{18}$ to $5 \times 10^{19}$ atoms/cm$^3$). At the same time, the nickel concentration within the channel regions 310 and 311 falls to $2 \times 10^{17}$ atoms/cm$^3$ or less (typically, from $1 \times 10^{14}$ to $5 \times 10^{16}$ atoms/cm$^3$).

At this point, the silicon nitride film 323 formed as a protective film prevents a tantalum film, used as a gate wiring material, from oxidizing. There is no problem if the gate wiring is difficult to oxidize, or if the oxide film formed by oxidation is easily etched, but not only is the tantalum film easily oxidized, an oxidized tantalum film is extremely difficult to etch. Therefore, it is desirable to form the protective silicon nitride film 323.

Figure 4C:
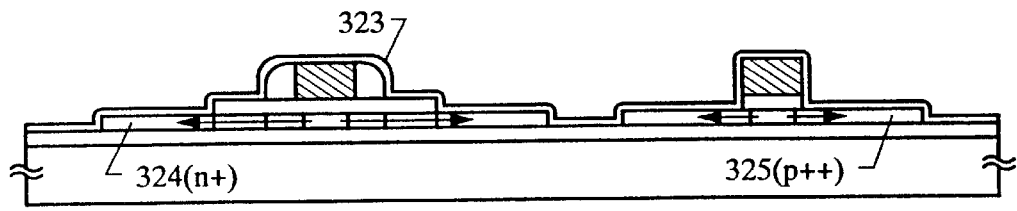

A first insulating film 326 is formed with a thickness of 1 m after the completion of the annealing process (gettering process) shown in FIG. 4C. A silicon oxide film, a silicon nitride film, an oxide silicon nitride film, an organic resin film, or a laminate of these films can be used as the first insulating film 326. An acrylic resin film is employed in embodiment 1.

After formation of the first insulating film 326, source wirings 327 and 328, and a drain wiring 329 are formed from a metallic material. A laminate wiring structure, in which a titanium-containing aluminum film is sandwiched with titanium, is used in embodiment 1.

Further, if BCB (benzocyclobutane) resin film is used as the first insulating film 326, the flatness will increase and at the same time it will become possible to use copper as a wiring material. The wiring resistance is low with copper, so it is an extremely effective wiring material.

After forming the source wiring and the drain wiring in this manner, a silicon nitride film 330 is formed with a thickness of 50 nm as a passivation layer. In addition, a second insulating film 331 is formed thereon as a protective film. The same material used for the first insulating film 326 may be used for the second insulating film 331. A laminate structure with an acrylic resin film on a 50 nm thick silicon oxide film is employed in embodiment 1.

Figure 4D:
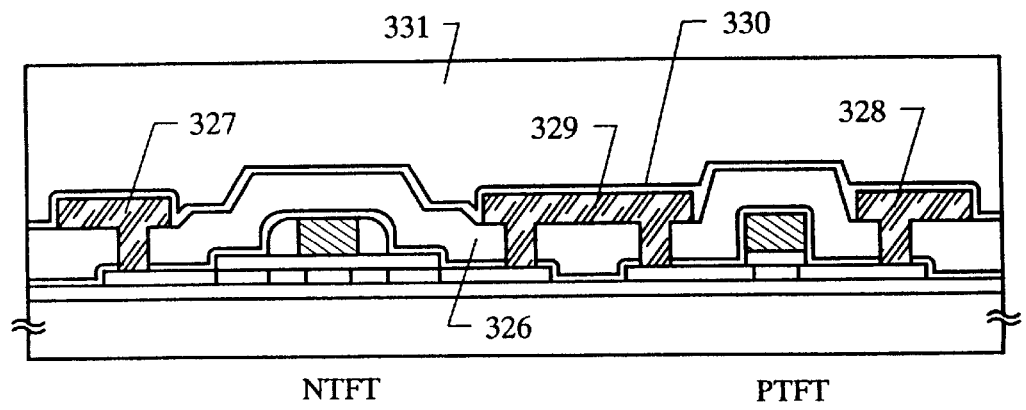

A CMOS circuit with the structure shown in FIG. 4D is completed through the above processes. For the CMOS circuit formed in embodiment 1, the reliability of the entire circuit sharply improves because the NTFT has an excellent reliability. Further, the characteristic balance (balance of electric characteristics) between the NTFT and the PTFT improves with a structure like that of embodiment 1, so making it more difficult for a defective operation to occur.

Further, the influence of nickel (catalyst element) inside the channel forming region, which is concerned about when the technique disclosed in the Japanese Patent Application Laid-open No. Hei 7-130652 as a prior art is employed, is resolved by performing a gettering process as in embodiment 1.

Note that the structure described in embodiment 1 is merely one example, and therefore has no necessary to limit embodiment 1 to the structures shown in FIGS. 3A to 3E, and in FIGS. 4A to 4D. The essential point in this invention is the structure of the NTFT active layer, and as long as that point is not changed, the effect of the present invention can be obtained.

[Embodiment 2]

Undoped Si (an intrinsic silicon layer or an undoped silicon layer), in which impurities are intentionally not doped, is used in embodiment 1 for the sidewalls. However, in embodiment 2, a phosphorous doped silicon layer ("n$^+$"-Si layer), in which phosphorous is doped during film formation, or a boron doped silicon layer ("p$^+$"-Si layer) is used. It is needless to say that the silicon layer may be amorphous, non-crystalline, or micro-crystalline.

By using a silicon layer doped with phosphorous or boron, the entire sidewall portion is made low resistance, and the possible change in characteristics originating in fluctuation of the phosphorous concentration profile can be eliminated, which is the fear of process shown in FIG. 3D.

[Embodiment 3]

Undoped Si (an intrinsic silicon layer or an undoped silicon layer), in which impurities are intentionally not doped, is used in embodiment 1 for the sidewalls. However, in embodiment 3, a silicon layer that contains either of carbon (C), nitrogen (N), or oxygen (O) is used, to thereby increase the resistive component of the sidewalls. Of course, the silicon layer may be either amorphous, crystalline, or micro-crystalline. Further, oxygen is best as the impurity to be used.

Namely, it may only dope with carbon, nitrogen, or oxygen at 1 to 50 atomic % (typically, from 10 to 30 atomic %) when forming the silicon layer that becomes the sidewalls. Oxygen at 20 atomic % is doped in this embodiment 3.

With employing the structure of embodiment 3, the resistive component due to the sidewalls becomes larger. Accordingly, it may take such a structure that the capacitive component in which the sidewalls act as the dielectric in response to the applied gate voltage becomes managingly effective. Namely, when driven at high frequency, the gate voltage can also be effectively applied to the sidewall portion.

[Embodiment 4]

Figure 6A:
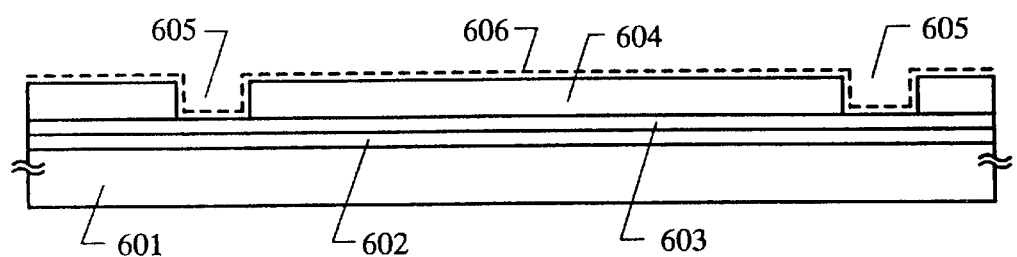
FIGS. 6A and 6B are drawings showing the manufacturing step of the polysilicon film of Embodiment 4.
Figure 6B:
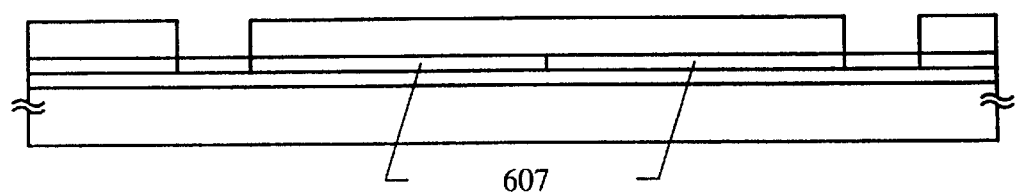

A description will be made of an example in the case where a semiconductor film including the crystals that become the active layer in embodiment 1 is crystallized by using the technique disclosed in Japanese Patent Application Laid-open No. Hei 8-78329. Note that the technique disclosed in Japanese Patent Application Laid-open No. Hei 8-78329 involves one being able to selectively crystallize a semiconductor film by selectively doping a catalytic element. FIGS. 6A and 6B explain the case where this technique is applied to the present invention.

First, a silicon oxide film 602 is formed on a stainless steel substrate 601, and an amorphous silicon film 603 and a silicon oxide film 604 are formed successively thereon. The silicon oxide film 604 has a thickness of 150 nm at this time.

Next, the silicon oxide film 604 is patterned to form an opening portion 605, and thereafter a 100 ppm by weight of nickel acetate salt solution containing nickel is coated. This becomes a state in which a formed nickel containing layer 606 only contacts the amorphous silicon film 602 through the bottom portion of the opening portion 605. (See FIG. 6A.)

Next, crystallization of the amorphous silicon film 602 is performed by a heat treatment at between 500 and 650° C., for 4 to 24 hours (at 580° C. for 14 hours in this embodiment 4). First, the portion in contact with nickel crystallizes, then the crystal growth proceeds almost parallel to the substrate during this crystallization process. In crystallography terms, it has been confirmed that crystallization proceeds in the <111> axis direction.

A polysilicon film 607 formed in this way is a collection of bar-like or needle-like crystals, and has the advantage of matching crystallinity since each of the cylindrical crystals grows in a specific direction macroscopically.

Note that the following elements can be used instead of nickel (Ni) for the above published technique, either singly or in combination: germanium (Ge); iron (Fe); palladium (Pd); tin (Sn); lead (Pb); cobalt (Co); platinum (Pt); copper (Cu); gold (Au); and silicon (Si).

A semiconductor film (including polysilicon films and polysilicon germanium films) containing crystals may be formed using the above technique, which may then undergo patterning to form a semiconductor film active layer containing crystals. Further processing may be performed in accordance with embodiment 1. It is needless to say that it is possible to combine embodiments 2and 3 as well.

When manufacturing a TFT by using a semiconductor film containing crystals that have been crystallized using the technique of this embodiment 4, it is possible to obtain high electric field effect mobility. However, a high reliability is demanded thereto. However, by employing the TFT structure of the present invention, it is possible to manufacture a TFT that maximizes the technique of this embodiment 4.

[Embodiment 5]

In this Embodiment 5, a description is made of an example in which embodiment 1 is combined with the techniques disclosed in Japanese Patent Application Laid-open No. Hei 10-135468 or Japanese Patent Application Laid-open No. Hei 10-135469.

The techniques described in these patent publications involve using the gettering action of a halogen element, after crystallization, to remove the nickel that has been used during crystallization of the semiconductor. The nickel concentration in the active layer can be reduced to $1\times10^{17}$ atoms/cm$^3$ or less (preferably, $1\times10^{16}$ atoms/cm$^3$ or less) by using these techniques.

Figure 7A:
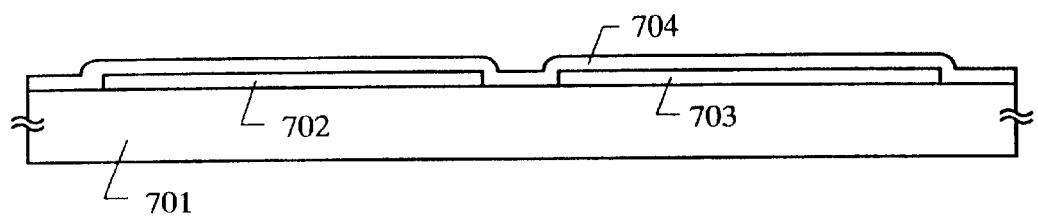
FIGS. 7A and 7B are drawings showing the manufacturing step of the polysilicon film of Embodiment 5.
Figure 7B:
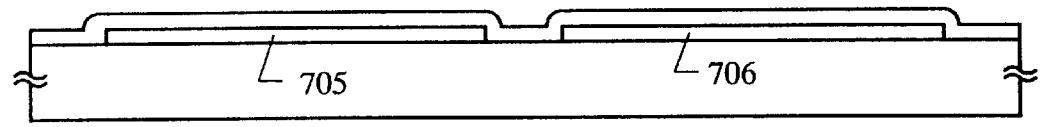

FIGS. 7A and 7B are used to explain the structure of embodiment 5. First, a quartz substrate 701 with high heat resistance is used. Of course, silicon substrates and ceramic substrates may also be used. When a quartz substrate is used, there is no contamination from the substrate side even if a silicon oxide film is not particularly formed as a base film.

Next a polysilicon film (not shown) is formed using the methods described in embodiment 1 or embodiment 4, then patterned to form active layers 702 and 703. In addition, a gate insulating film 704 is formed from a silicon oxide film, covering the active layers 702 and 703. (See FIG. 7A.)

A heat treatment is performed in an atmosphere containing halogen after the gate insulating film 704 is formed. The processing atmosphere of this embodiment 5 is an oxidizing atmosphere combining oxygen and hydrogen chloride, the processing temperature is 950° C., and the processing time is 30 minutes. Note that the processing temperature may be set from 700 to 1,150° C. (typically, from 800 to 1,000° C.), and the processing time may be set from 10 minutes to 8 hours (typically from 30 minutes to 2 hours). (See FIG. 7B.)

At this time, the nickel becomes a volatile nickel chloride compound and spreads throughout the processing atmosphere, and the nickel concentration in the polysilicon film is reduced. Therefore, the concentration of nickel in the active layers 705 and 706 shown in FIG. 7B is reduced to $1\times10^{17}$ atoms/cm$^3$ or less.

After forming an active layer using the techniques of embodiment 5 above, further processing may be performed in accordance with embodiment 1. Of course, it is also possible to combine with any of embodiments 2 to 5. It has especially been shown that an extremely high crystallinity in the polysilicon film can be achieved with a combination of embodiment 5 with embodiment 4.

(Knowledge related to the crystal structure of the active layer)

Looking microscopically at a semiconductor layer (active layer) formed in accordance with the above manufacturing processes, one finds a crystal structure consisting of multiple needle-like or bar-like crystals (hereafter referred to as bar-like crystals). It is easy to confirm this by observation using a TEM (transmission electron microscope).

In addition, it has been verified by using electron diffraction and x-ray diffraction that although there is some crystal axis deviation on the surface of the active layer (the channel forming portion), the principal orientation face is {110}. As a result of detailed observation of electron beam diffraction photographs with a spot diameter of 1.5 μm, the present applicant found that the diffraction spot appeared cleanly in correspondent with the {110} face, and that each spot had a concentric distribution.

Further, the present applicant observed the grain boundaries formed by each of the contacting bar-like crystals using an HR-TEM (high resolution transmission electron microscope) and verified that the crystal lattice in the grain boundaries has continuity. This was easily verified by the continuous connection of the observed lattice stripes in the grain boundaries.

Note that the continuity of the lattice in the grain boundaries originates in the fact that the grain boundaries are "planar shape grain boundaries." The definition of planar shape boundaries in this specification is described in "characterization of High-Efficiency Cast-Si Solar Cell Wafers by MBIC Measurement; Ryuichi Shimokawa and Yutaka Hayashi, Japanese Journal of Applied Physics vol. 27, no. 5, pp. 751–758, 1988."

According to the above paper, planar shape grain boundaries includes twin crystal grain boundaries, special stacking faults, special twist grain boundaries, etc. This planar shape grain boundary possesses a characteristic in that it is inactive electrically. Namely, the grain boundaries can essentially be seen as non-existent, because they do not function as a trap that obstructs the movement of a carrier.

Especially for the cases where the crystal axis (the axis perpendicular to the crystal face) is the <110> axis, {211} twin crystal grain boundaries can be called grain boundaries corresponding to Σ3. The Σ value is a parameter that indicates the degree of matching in corresponding grain boundaries, and it is known that the smaller Σ value the better matching grain boundary is.

Using a TEM, the present applicant observed in detail a polysilicon film obtained by implementing the present invention, and determined that most of the crystal grain boundaries (90% or more, typically 95% or more) had grain boundaries corresponding to Σ3. In other words, the grain boundaries were {211} twin grain boundaries.

For the case of two crystals having a {110} face orientation, if the lattice stripes corresponding to the {111 } face in the grain boundary formed between both crystals has an angle θ, then when θ=70.5°, the grain boundaries correspond to Σ3.

Neighboring grain lattice stripes in the grain boundaries of the polysilicon film in this embodiment 5 is continuous at just about 70.5°. From this one can arrive at the conclusion that the grain boundaries are {211} twin grain boundaries.

Note that θ=38.9° corresponds to Σ9, and other grain boundaries like this also exist.

This type of grain boundary correspondence is only formed between grains in the same face orientation. In other words, the polysilicon film obtained in this embodiment 5 has a face orientation roughly matched to {110}, and therefore this grain boundary correspondence is formed over a wide area.

This type of crystal structure (literally, grain boundary structure) shows that two different grains are joined together with extremely good matching in the grain boundaries. Namely, a crystal structure in which the crystal lattice has continuity in the grain boundaries, and in which it is very difficult to create a trap caused by crystal defects etc. Therefore, it is possible to regard semiconductor thin films having this type of crystal structure as ones in which grain boundaries do not substantially exist.

In addition, it has been verified by TEM that defects within the grain boundaries almost completely disappear with a heat treatment process at a high temperature of 700 to 1,150° C. It is evident that there is a large decrease in the number of defects around this type of heat treatment process.

The difference in the number of defects appears as the difference in spin density by electron spin resonance (ESR). At present, polysilicon films manufactured in accordance with the processes of this embodiment 5 have been shown to have a spin density of at most $5\times10^{17}$ spins/cm$^3$ or less (preferably, $3\times10^{17}$ spins/cm$^3$ or less). However, this measurement value is near the detection limits of the present measuring equipment, and it is expected that the real spin density is even lower.

From the above, the polysilicon film obtained by embodying this embodiment 5 has essentially no internal grains or grain boundaries, so that it can be thought of as a single crystal silicon film or essentially a single crystal silicon film. The present applicant calls a polysilicon film with this type of crystal structure CGS (continuous grain silicon). Information regarding CGS is on record and can be referred to in Japanese Patent Application Serial No. Hei 10-044659, Japanese Patent Application Serial No. Hei 10-152316, Japanese Patent Application Serial No. Hei 10-152308, and Japanese Patent Application Serial No. He 10-152305 submitted by the applicant of the present invention.

(Knowledge related to TFT electrical characteristics)

The TFT manufactured in this embodiment 5 showed electrical characteristics equivalent to a MOSFET. Data showing the following was obtained from a TFT test manufactured by the present applicant.

(1) The subthreshold coefficient, which is an index of the switching performance (the quickness of on/off switching), is small at between 60 and 100 mV/decade (typically, from 60 to 85 mV/decade) for both an n-channel type TFT and a p-channel type TFT.

(2) The electric field effect mobility ($\mu_{FE}$), which is an index of the TFT operation speed, is large at between 200 and 650 cm$^2$/Vs (typically, between 300 and 500 cm$^2$/Vs) for an n-channel type TFT, and between 100 and 300 cm$^2$/Vs (typically between 150 and 200 cm$^2$/Vs) for a p-channel type TFT.

(3) The threshold voltage ($V_{th}$), which is an index of the driving voltage for the TFT, is small at between −0.5 and 1.5 V for an n-channel type TFT, and between −1.5 and 0.5 V for a p-channel type TFT.

The above verifies that it is possible to realize extremely excellent superior switching characteristics and high speed operation.

(Knowledge related to circuit characteristics)

Next, the frequency characteristics of a ring oscillator manufactured using a TFT formed in accordance with this embodiment 5 are shown. A ring oscillator is a circuit in which CMOS structure inverter circuits are connected in a ring state with an odd number of layers, and is used to get a delay time in each of the inverter circuit layers. The structure of the oscillator used for the experiment is as follows.

Number of layers: 9
Film thickness of gate insulating film in TFT: 30 nm and 50 nm
TFT gate length: 0.6 μm The oscillation frequency of the ring oscillator was investigated, and the largest oscillation frequency able to be obtained was 1.04 GHz. Further, one actual LSI circuit TEG, a shift register, was manufactured and its operating frequency was verified. As a result, a 100 MHZ output pulse operating frequency was obtained with a gate insulating film with a film thickness of 30 nm, a gate length of 0.6 m, a voltage supply of 5 V, and 50 stages of a shift register circuit.

The amazing data above for a ring oscillator and a shift register shows that the TFT of this embodiment 5 has a performance (electrical characteristics) equivalent to, or surpassing, a MOSFET.

[Embodiment 6]

Embodiment 6 shows an example in which, after forming a polysilicon film using a catalytic element (nickel is exemplified) as in embodiment 1 and embodiment 4, a process is performed to remove the nickel remaining throughout the film. The techniques disclosed in Japanese Patent Application Laid-open No. Hei 10-270363 and Japanese Patent Application Laid-open 10-247735 are used as the nickel removing technique in this embodiment 6.

The technique disclosed in Japanese Patent Application Laid-open No. Hei 10-270363 is a technique that employs a periodic table group 15 element (phosphorous is typical) for a gettering action after the crystallization process to remove the nickel that has been used during the semiconductor crystallization. Employment of this technique enables to reduce the nickel concentration in the active layer to $1\times10^{17}$ atoms/cm$^3$ or less (preferably, $1\times10^{16}$ atoms/cm$^3$ or less).

Figure 5A:
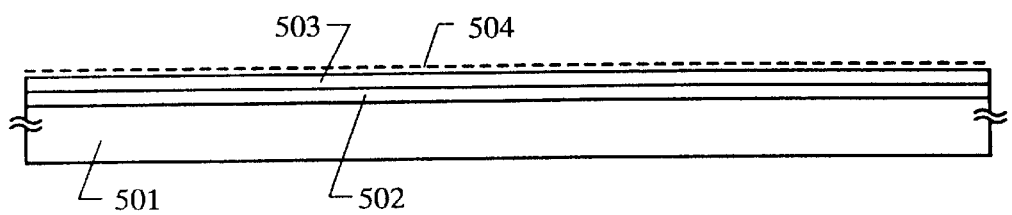
FIGS. 5A and 5B are drawings showing the manufacturing step of a polysilicon film of Embodiment 1.
Figure 5B:
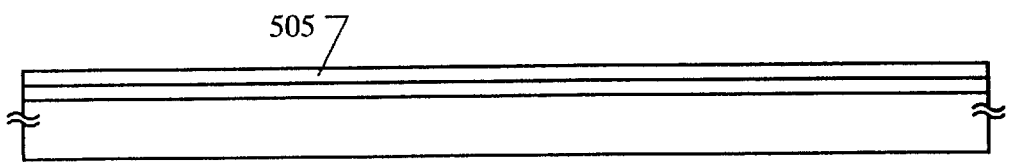
Figure 22A:
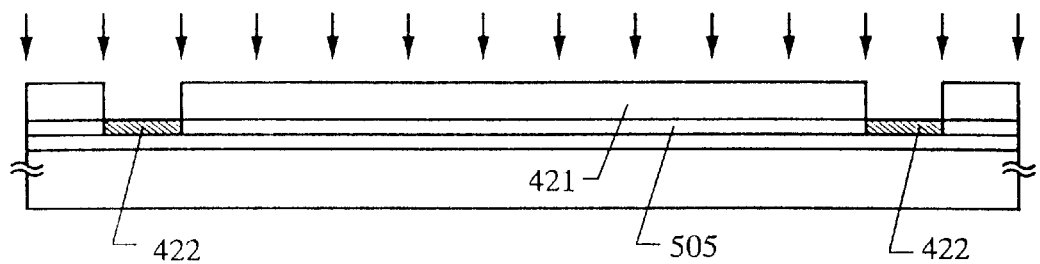
FIGS. 22A and 22B are drawings showing the manufacturing step of the polysilicon film of Embodiment 6.
Figure 22B:
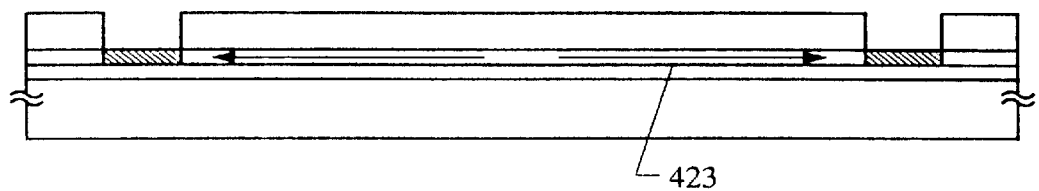

FIGS. 22A and 22B show a case where this technique is applied to the present invention. First, the processes of embodiment 1 shown in FIGS. 5A and 5B are performed to form the polysilicon film 505. Next, an insulating mask film 421 with an opening portion is formed, and phosphorous is doped in this state. At this time, a high concentration of phosphorous is doped into the region of the polysilicon film exposed by the opening portion. The region formed is called a gettering region 422. (See FIG. 22A)

The gettering region 422 is doped to a phosphorous concentration of between 1 10$^{19}$ and $1\times10^{21}$ atoms/cm$^3$ (typically, between $1\times10^{17}$ and $1\times10^{20}$ atoms/cm$^3$).

Next, a heat treatments is performed at between 550 to 650° C. for 4 to 15 hours (at 600° C. for 12 hours in this embodiment 6). The catalytic element (nickel in this embodiment 6) remaining throughout the polysilicon film 505 moves in the direction of the arrow during the heat treatment, and is captured (gettered) throughout the gettering region 422. This region is labeled the gettering region 422 for this region. A polysilicon film 423 formed in this way has a nickel concentration throughout the film that has been reduced to $1\times10^{17}$ atoms/cm$^3$ or less.

Furthermore, the technique disclosed in Japanese Patent Application Laid-open No. Hei 10-247735 is a technique characterized in that after performing crystallization using the technique disclosed in Japanese Patent Application Laid-open No. Hei 8-78329, the mask used to selectively dope the catalytic element is left in place and used as a mask for phosphorous dope. This technique is extremely effective for increasing throughput.

A semiconductor film (including polysilicon films and polysilicon germanium films) containing crystals can be formed by using the above techniques according to this embodiment 6, patterned, and formed into an active layer. Further processes may be carried out in accordance with embodiment 1. In addition, by combining embodiment 6 with the gettering technique of embodiment 1, it is possible to additionally reduce the amount of catalyst remaining in the channel forming region. It is needless to say that it is also possible to combine this embodiment 6 with any of embodiments 2 to 4.

[Embodiment 7]

FIGS. 8A to 8D show an example of embodiment 7, in which the formation processes for the silicon nitride film 323, formed by the gettering process (FIG. 4C) shown in embodiment 1, are performed at a different stage.

First, processing is performed in accordance with embodiment 1 until the process of FIG. 3B, and then a 1–10 nm (preferably, from 2 to 5 nm) thick silicon nitride film 801 is formed. If the film thickness of the silicon nitride film is too thick, however, the gate overlap structure used for a sidewall 802 can become impossible to realize, so that it is preferable to make it thin. However, it is necessary to be careful not to harm the effect in which the gate wiring (for the case of tantalum) is protected from oxidizing during later heat treatment processes.

Next, an amorphous silicon film (not shown) is formed on the silicon nitride film 801, and sidewalls 802 and 803 are formed by anisotropic etching. (See FIG. 8A.)

Note that it is also possible to use a structure as in embodiment 2 or embodiment 3 for the structure of the sidewalls 802 and 803.

Figure 8A:
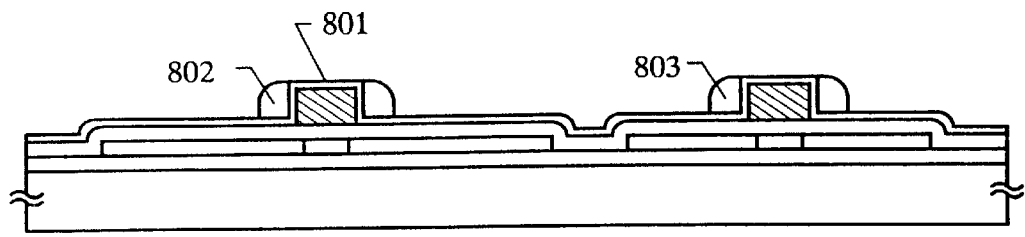
FIGS. 8A to 8D are drawings showing the manufacturing step of the CMOS circuit of Embodiment 7.

Next, a phosphorous doping process is performed in the state of FIG. 8A, to thereby form second impurity regions 804 and 805. Note that conditions that are almost the same as those in embodiment 1 may be used; however, it is preferable to optimize the acceleration voltage and the power with taking the film thickness of the silicon nitride film 801 into consideration.

After forming the second impurity regions 804 and 805, resist masks 806 and 807 are formed, and gate insulating films 808 and 809 are formed by dry etching of a part of the gate insulating film. (See FIG. 8B.)

Figure 8B:
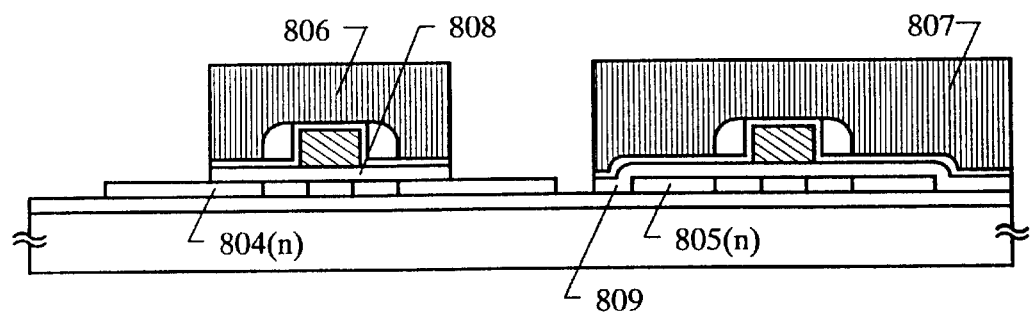

Next, a phosphorous doping process is again performed in the state of FIG. 8B, thereby forming a third impurity region 810. Then, after removing the resist masks 806 and 807, a resist mask 811 is formed and the sidewall 803 is removed. A boron doping process is performed at this state. Note that conditions that are almost the same as those in embodiment 1 may be used, but as above, it is desirable to optimize the acceleration voltage and the power with taking the film thickness of the silicon nitride film 801 into consideration. This forms a fourth impurity region 812.

Note that the structure explained in embodiment 1 may be used regarding the phosphorous concentration and the boron concentration contained in the third impurity region 810 and the fourth impurity region 812. Of course, there is no need to limit these to the values of embodiment 1.

Figure 8C:
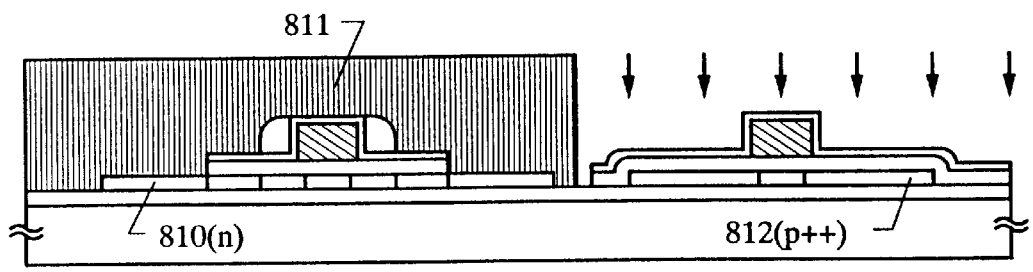
Figure 8D:
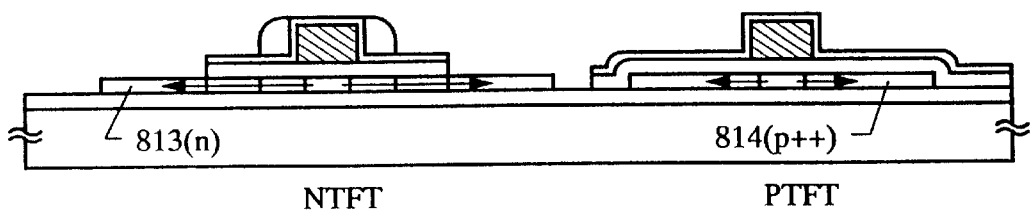

After obtaining the conditions in FIG. 8C, a heat treatment process is performed for gettering, at the same conditions as in embodiment 1. After the heat treatment process, a nickel concentration of between $1\times10^{17}$ and $1\times10^{20}$ (typically, between $1\times10^{18}$ and $5\times10^{19}$ atoms/cm$^3$) remains in the third impurity region 813 and the fourth impurity region 814. The relationship of the nickel concentration to the channel forming region has already been explained.

A CMOS circuit is completed by performing, in order, the same processes as those of embodiment 1, after the above processes are finished. The difference between the structure of embodiment 7 and the structure shown in FIG. 1 is that the gate insulating film 809 exists on the PTFT side for the case of embodiment 7.

The structure and processes of this embodiment 7 do not impede the effect of the present invention, and a semiconductor device with high reliability can be manufactured. Note that embodiment 7 can be freely combined with any of embodiments 2 to 6.

[Embodiment 8]

In this embodiment 8, a description will be made of an example of a case in which the structure of embodiment 7 is varied, with reference to FIGS. 9A to 9D. Specifically, it is characterized in that this embodiment 7 includes a process in which a silicon nitride film formed in order to protect the gate wiring is etched using the sidewalls as masks.

First, processing is performed in accordance with the processes of embodiment 1 until the processes of FIG. 8A. Thereafter, the sidewalls 802 and 803 are used as a mask and the silicon nitride film 801 is etched, to thereby form silicon nitride films 901 and 902 with the shape shown. (See FIG. 9A.)

Figure 9A:
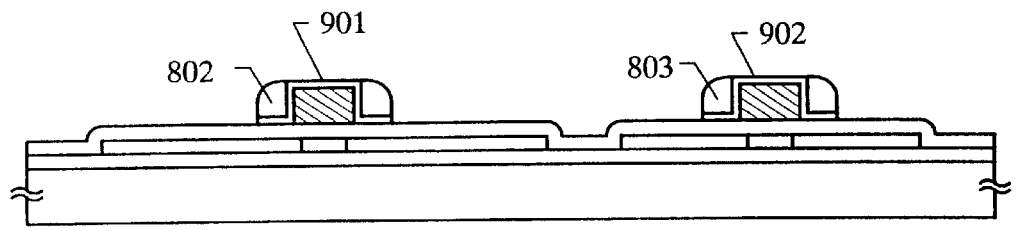
FIGS. 9A to 9D are drawings showing the manufacturing step of the CMOS circuit of Embodiment 8.

Next, a phosphorous doping process is performed in the state of FIG. 9A, thereby forming second impurity regions 903 and 904. Note that conditions that are almost the same as those in embodiment 1 may be used; however, it is desirable to optimize the acceleration voltage and the power with taking the film thickness of the silicon nitride film 901 into consideration.

After forming the second impurity regions 903 and 904, resist masks 905 and 906 are formed, and gate insulating films 907 and 908 are formed by dry etching the gate insulating film. (See FIG. 9B)

Figure 9B:
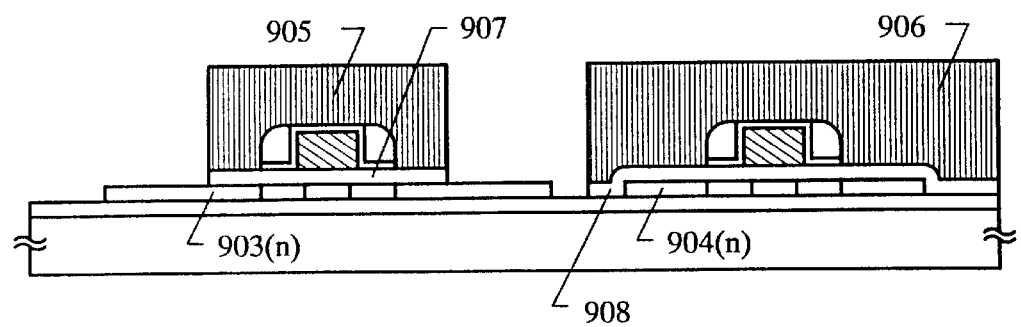

Next, a phosphorous doping process is again performed in the state of FIG. 9B to form a third impurity region 909. Then, after removing the resist masks 905 and 906, a resist mask 910 is formed and the sidewall 803 is removed. A boron doping process is performed at this state. Note that conditions of the boron addition process which are almost the same as those in embodiment 1 may be used, but as above, it is desirable to optimize the acceleration voltage and the power with taking the film thickness of the silicon nitride film 901 into consideration. Thus, a fourth impurity region 911 is formed.

Note that the structure explained in embodiment 1 may be used regarding the phosphorous concentration and the boron concentration contained in the third impurity region 909 and the fourth impurity region 911. Of course, there is no need to limit these to the values of embodiment 1.

Figure 9C:
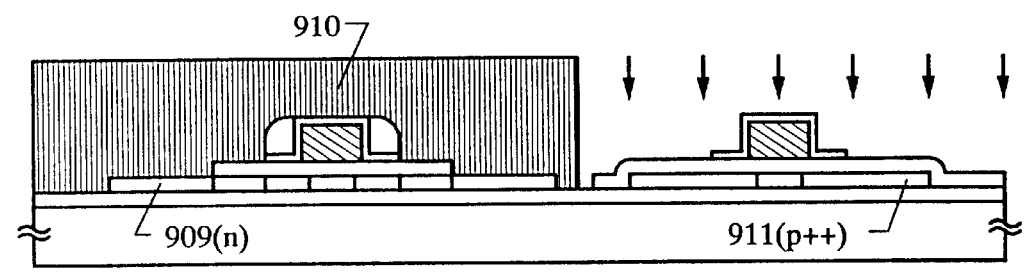
Figure 9D:
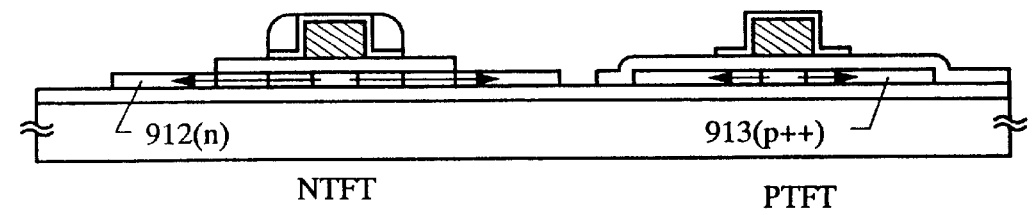

After the conditions in FIG. 9C is thus obtained, a heat treatment is performed for gettering, at the same conditions as in embodiment 1. After the heat treatment process, a nickel concentration of between $1\times10^{17}$ and $1\times10^{20}$ (typically, between $1\times10^{18}$ and $5\times10^{19}$ atoms/cm$^3$) remains in the third impurity region 912 and the fourth impurity region 913. The relationship of the nickel concentration to the channel forming region has already been explained.

A CMOS circuit is completed by performing, in order, the same processes as those of embodiment 1, after the above processes are finished. The difference between the structure of embodiment 8 and the structure shown in FIG. 1 resides in that the gate insulating film 902 and the silicon nitride film 908 exist on the PTFT side for the case of embodiment 8.

The structure and processes of this embodiment 8 do not impede the effect of the present invention, and a semiconductor device with high reliability can be manufactured. Note that embodiment 8 can be freely combined with any of embodiments 2 to 6.

[Embodiment 9]

An etching process of the gate insulating film 305 in FIG. 3E is performed in embodiment 1, but that process can be omitted and the gate insulating film 305 can remain until the final processing. A description will be made of this embodiment 8 by referring FIGS. 10A and 10B.

Figure 10A:
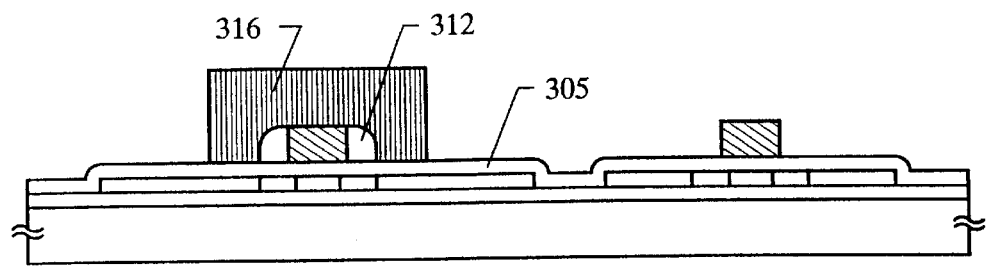
FIGS. 10A and 10B are drawings showing the manufacturing step of the CMOS circuit of Embodiment 9.

FIG. 10A shows the state of the gate insulating film 305 just before etching in FIG. 3E of embodiment 1. The processes of FIG. 4A to 4C are performed in this state. At this time, the process (phosphorous doping process) shown in FIG. 4A becomes a through doping process (an impurity doping process that goes through the insulating film). Therefore it is necessary to set the acceleration voltage higher, at between 80 and 100 KeV.

Additionally, the boron doping process of FIG. 4B similarly becomes a through doping process. It is also necessary to set the acceleration voltage higher in this case, at between 70 and 90 KeV.

Figure 10B:
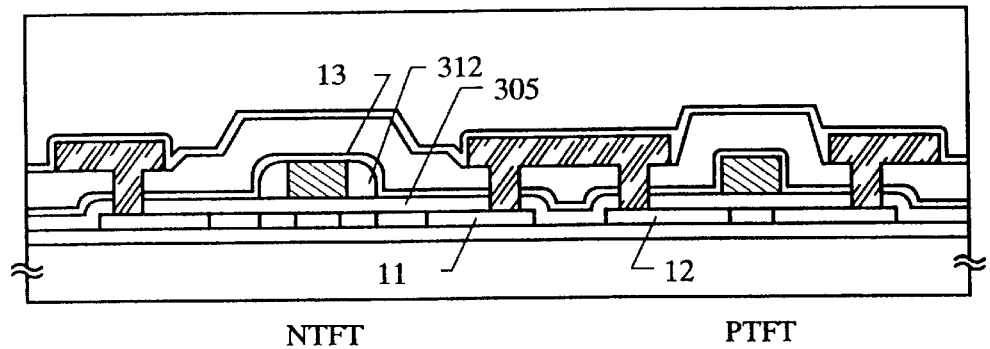

Further, a CMOS circuit with the structure shown in FIG. 10B can be obtained by continuing to perform processing until the heat treatment for gettering. Note that this is structurally almost identical to the structure shown in FIG. 1, so that a detailed explanation thereof is omitted here. Only numerals necessary for explaining its unique points are added here.

The structure of embodiment 9 is a state in which a third impurity region 11 and a fourth impurity region 12 are completely covered by the gate insulating film 305. Namely, there is no worry of contamination to the active layer from the processing environment because it is not exposed after the gate insulating film 305 is formed.

Further, a silicon nitride film 13, formed with the purpose of protecting the gate wiring, is formed with a shape that covers the gate insulating film 305, the sidewall 312, and the gate wiring, and differs in this point from FIG. 1.

Note that embodiment 9 can be freely combined with the structure of any of the embodiments 2 to 6.

[Embodiment 10]

Figure 11A:
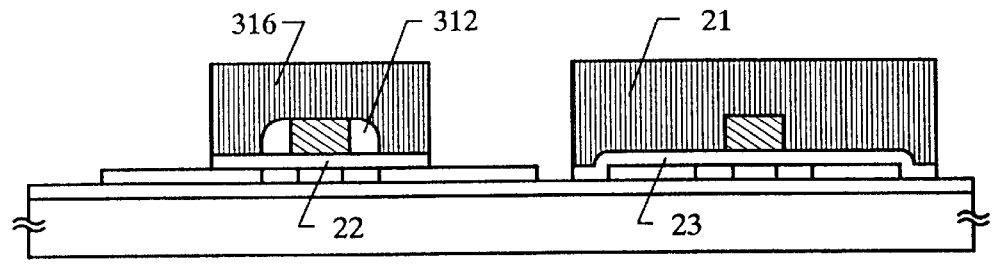
FIGS. 11A and 11B are drawings showing the manufacturing step of the CMOS circuit of Embodiment 11.

Embodiment 10 is explained with reference to FIGS. 11A and 11B, in which the third impurity region on the NTFT side is formed by a bare doping process (a process in which an impurity is directly doped into the active layer, not going through an insulating film), and on the PTFT side is formed by a through doping process.

In embodiment 10, a resist mask 21 is formed at the same time as the resist mask 316 in FIG. 3E is formed. The gate insulating film 305 is etched using the resist masks 316 and 21 as masks, forming gate insulating films 22 and 23. (See FIG. 11A)

In this state the processes until FIG. 4A to 4C are performed. The process shown in FIG. 4A (a phosphorous doping process) is a bare doping process, so the conditions at this time may be the same as those in embodiment 1. However, the boron doping process in FIG. 4B becomes a through doping process, so it is necessary to set the acceleration voltage high (between 70 and 90 KeV).

Figure 11B:
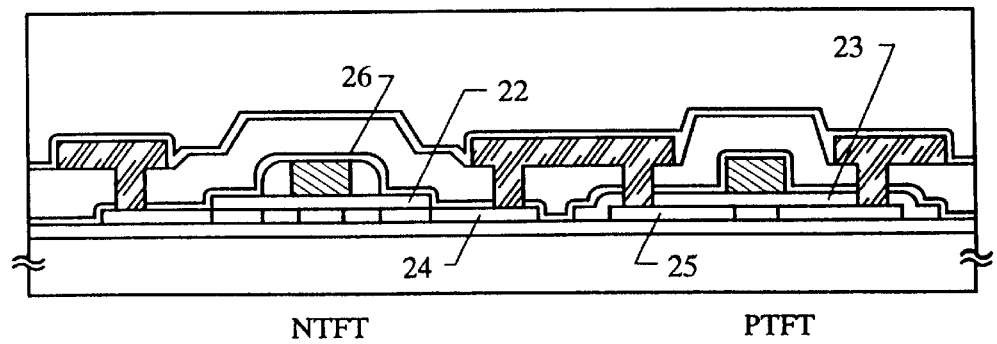

Further, a CMOS circuit with the structure shown in FIG. 11B can be obtained by continuing to perform processing until the heat treatment process for gettering. Note that this is structurally almost identical to the structure shown in FIG. 1, so a detailed explanation is omitted here. Only numerals necessary for explaining its unique points are added here.

The structure of embodiment 10 is a state in which a third impurity region 24 is not covered by the gate insulating film 22 (actually a small amount of phosphorous wraps around, so that they overlap each other), and a fourth impurity region 25 is completely covered by the gate insulating film 23.

Further, a silicon nitride film 26, formed with the purpose of protecting the gate wiring, is formed with a shape that covers the gate insulating film 22, the third impurity region 24, the sidewall 312, and the gate wiring, and differs in this point from FIG. 1.

Note that embodiment 10 can be freely combined with the structure of any of the embodiments 2 to 6.

[Embodiment 11]

In embodiment 10, the third impurity region on the NTFT is formed by a bare doping process, and the fourth impurity region on the PTFT is formed by a through doping process. In embodiment 11, the processes are reversed. Embodiment 11 is an example in which the third impurity region on the NTFT is formed by a through doping process, and the fourth impurity region on the PTFT is formed by a bare doping process.

In implementing embodiment 11, after the second phosphorous doping process on the state in FIG. 10A, a new resist mask is formed to completely cover the NTFT, and the gate insulating film 305 is only etched on the PTFT side.

Doing this leads to a state in which only the NTFT active layer is covered with the gate insulating film, and on the PTFT side the gate insulating film remains only directly beneath the gate wiring. Further processes may be performed in accordance with embodiment 1 and their explanation is omitted here. However, the phosphorous doping process that forms the third impurity region is replaced with a through doping process, so it is necessary to set the acceleration voltage to approximately 90 KeV (for this process).

Note that embodiment 11 can be freely combined with the structure of any of embodiments 2 to 6.

[Embodiment 12]

Figure 15A:
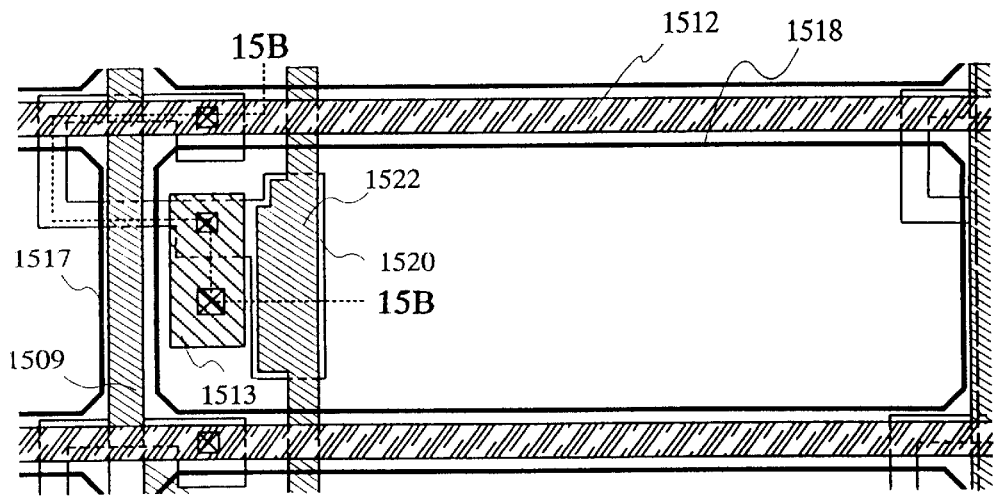
FIGS. 15A to 15C are drawings showing the structure of a pixel matrix circuit of Embodiment 12.
Figure 15B:
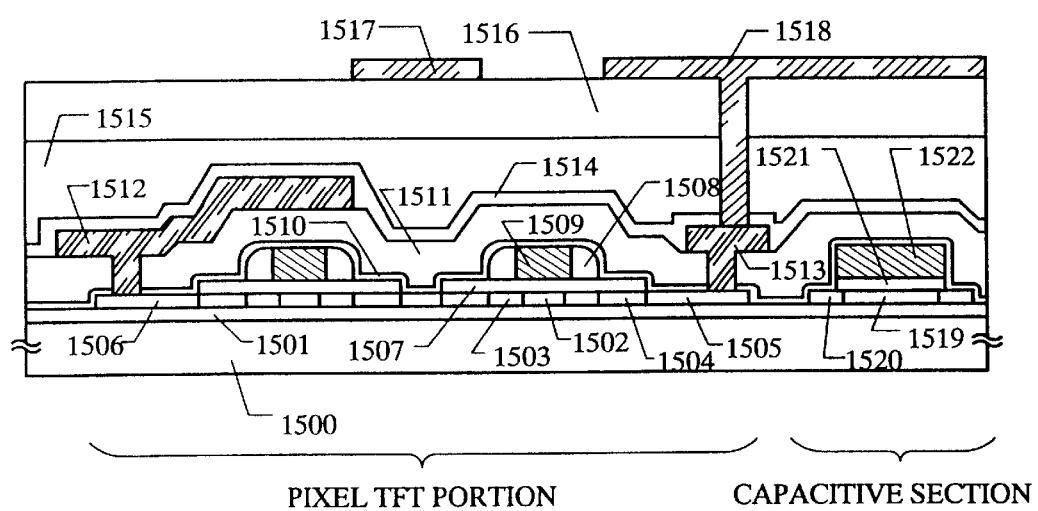
Figure 15C:
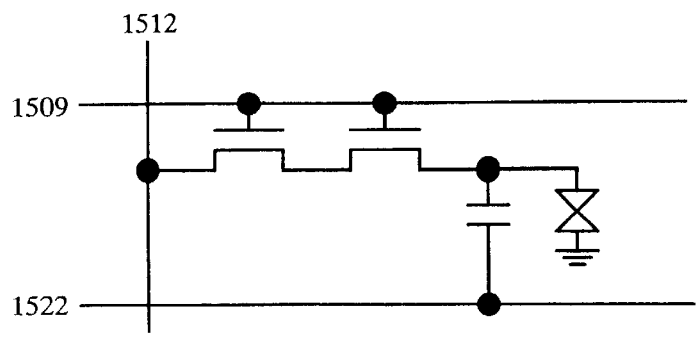

Embodiment 1 was explained using a CMOS circuit as an example, but in embodiment 12, a case where the present invention is applied to a pixel matrix circuit (display section) in an active matrix type liquid crystal display panel is explained. FIGS. 15A to 15C are used for the explanation. Note that FIG. 15B is a cross sectional structure diagram taken along the A—A of FIG. 15A, and FIG. 15C corresponds to the equivalent circuit. Further, the pixel TFT shown in FIG. 15B is a double gate structure in which the same structure NTFT is connected in series, so only one of them which is given by numerals is explained.

First, the following are all formed on a substrate 1500 in accordance with the processes of embodiment 1: a base film 1501; a channel forming region 1502; a first impurity region 1503; a second impurity region 1504; third impurity regions 1505 and 1506; a gate insulating film 1507; a gate wiring 1509; a sidewall 1508; a silicon nitride film 1510; a first insulating film 1511; a source wiring 1512; and a drain wiring 1513.

Then a silicon nitride film 1514 and a second insulating film 1515 are formed as passivation films on each of the wirings. In addition, a third interlayer insulating film 1516 is formed thereon, and a pixel electrode 1518 is formed out of a transparent conductor film such as ITO (indium tin oxide), $SnO_2$, or a zinc oxide/indium oxide compound. Reference numeral 1517 also denotes a pixel electrode.

In addition, the capacitive section is formed by: a capacitive wiring 1522 as the upper portion electrode; an undoped silicon layer 1519 (an intrinsic semiconductor layer or a semiconductor layer doped with boron to a concentration between $1\times10^{16}$ and $5\times10^{18}$ atoms/cm$^3$) together with an impurity region 1520 (containing phosphorous at the same concentration as the that of the first impurity region 1503) as the lower portion electrode; and an insulating film 1521 (formed at the same time as the gate insulating film 1507) sandwiched by the upper and lower electrodes. Note that the capacitive wiring 1522 is formed at the same time as the gate wiring 1509 on the pixel TFT, and is electrically connected to either ground or to a fixed voltage source.

Further, the insulating film 1521 has the same material composition as the gate insulating film 1507 on the pixel TFT, and the undoped silicon layer 1519 has the same material composition as the channel forming region 1502 on the pixel TFT.

Therefore, integration is possible by manufacturing the pixel TFT, the capacitive section, and the CMOS circuit at the same time on the same substrate. A transmission type LCD is taken as one example and explained for embodiment 12, but of course there is no need to limit embodiment 12 to that.

For example, it is possible to manufacture a reflective type LCD by using a reflective conducting material for the pixel electrode, and appropriately changing the patterning of the pixel electrode or either adding or reducing processes.

In addition, a double gate structure is used for the gate wiring on the pixel TFT of the pixel matrix circuit in embodiment 12, but in order to reduce fluctuations in the off current, a triple gate structure or other multiple gate structure may be employed. Further, a single gate structure may be used in order to increase the opening ratio (degree).

Note that the structure of embodiment 12 can be freely combined with the structure of any of embodiments 1 to 11.

[Embodiment 13]

Figure 16:
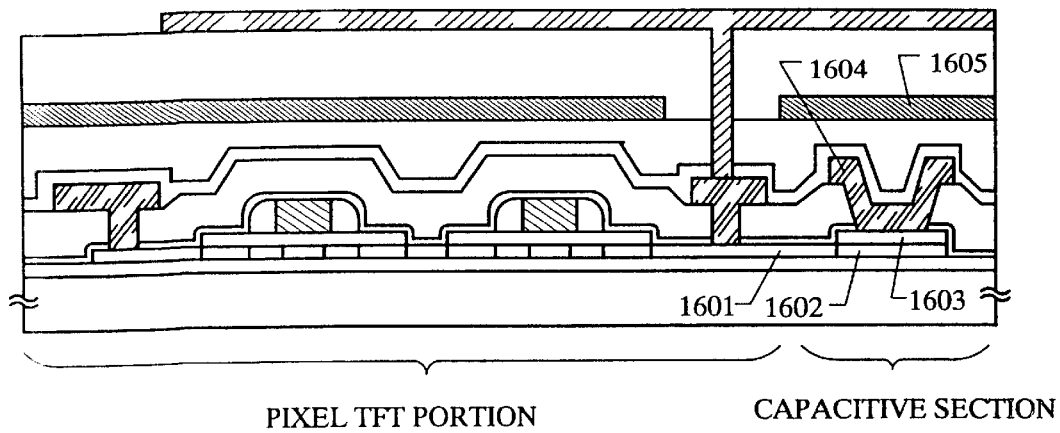
FIG. 16 is a drawing showing the structure of the pixel matrix circuit of Embodiment 13.

An example of embodiment 13, in which the capacitive section having a different structure from that of embodiment 12 is formed with a different structure, is shown in FIG. 16. The basic structure is nearly the same as that of embodiment 12, so only the points of difference will be explained. The capacitive section of embodiment 13 is formed by an impurity region 1602 (containing the same phosphorous concentration as that of the second impurity region) connected to a third impurity region 1601, an insulating film 1603 formed at the same time as the gate insulating film, and a capacitive wiring 1604.

In addition, a black mask 1605 is formed on the TFT side of the substrate. Note that the capacitive wiring 1604 is formed at the same time source wiring and drain wiring of the pixel TFT, and is electrically connected to either ground or to a fixed voltage source. Integration is possible by manufacturing the pixel TFT, the capacitive section, and the CMOS circuit at the same time on the same substrate. Of course embodiment 13 can be freely combined with any of embodiments 1 to 11.

[Embodiment 14]

Figure 17:
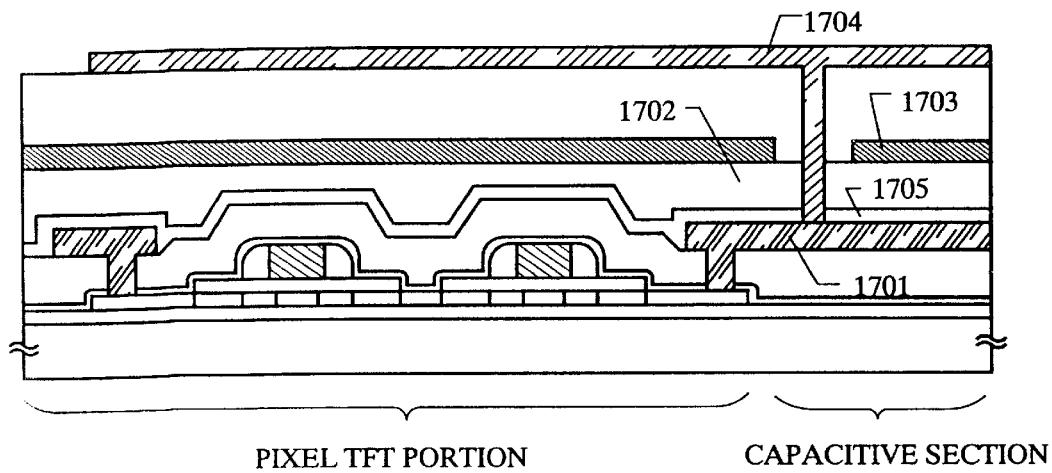
FIG. 17 is a drawing showing the structure of the pixel matrix circuit of Embodiment 14.

An example of embodiment 14, in which the capacitive section that differs from those of embodiments 12 and 13 is formed, is shown in FIG. 17. The basic structure is nearly the same as that of embodiment 12, so only the points of difference are explained. First, a second insulating film 1702 and a black mask 1703, made from a conducting material having light shielding properties, are formed. In addition, a third interlayer insulating film 1704 is formed thereon, and a pixel electrode 1705 is formed out of a transparent conducting film such as ITO or SnO2.

Note that the black mask 1703 covers the pixel TFT section, and moreover forms a capacitive section with the drain wiring 1701. At this time, the capacitive section dielectric is the second insulating film 1702. In addition, it is possible to have a structure in which a portion of the second insulating film 1702 is etched, uncovering a silicon nitride film 1706 formed as a passivation film, and then only the silicon nitride film 1706 is used as the dielectric.

Therefore, integration is possible by manufacturing the pixel TFT, the capacitive section, and the CMOS circuit at the same time on the same substrate. Of course, embodiment 14 can be freely combined with any of embodiments 1 to 11.

[Embodiment 15]

Figure 18:
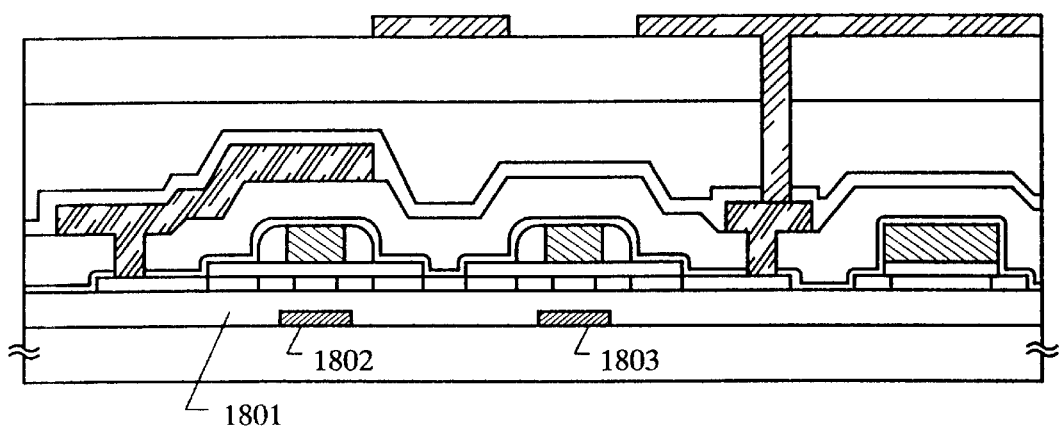
FIG. 18 is a drawing showing the structure of the pixel matrix circuit of Embodiment 15.

FIG. 18 is used to explain embodiment 15. In embodiment 15 back gate electrodes 1802 and 1803 are formed below the pixel TFT channel forming region, through an insulating film 1801. Note that the back gate electrodes referred to here are electrodes formed with the aim of controlling the threshold voltage and reducing the off current, and pseudo gate electrode is formed on the reverse side to the gate wiring, with the active layer (channel forming region) sandwiched therebetween.

The back gate electrodes 1802 and 1803 can be used with no problems if they are made of conducting materials. The present invention involves a heat treatment process at 550 to 650° C. for catalytic element gettering, so a material with heat resisting properties that can stand up to high temperature as above is required. For example, it is effective to use a silicon gate electrode made from a polysilicon film (either intrinsic or doped with impurities).

In addition, the insulating film 1801 functions as a gate insulating film on the back gate electrode, so that a high quality insulating film with few pinholes, etc., is used. A silicon oxide nitride film is used in embodiment 15, but others such as a silicon oxide film or a silicon nitride film can also be used. However, it is desirable to use a material that can realize as flat a face as possible because a TFT will be manufactured thereon.

By applying a voltage to the back gate electrodes 1802 and 1803 in embodiment 15, the electric field distribution in the channel forming region is changed, and it is possible to control the threshold voltage and to reduce the off current. This is especially effective for a pixel TFT like the one in embodiment 15.

Note that the structure of embodiment 15 can be freely combined with of any of embodiments 1 to 14.

[Embodiment 16]

In embodiment 16 a circuit is constructed with TFTs formed by implementing the present invention. An example case of the manufacture of an active matrix type liquid crystal display panel formed by integrating a driver circuit (shift register circuit, buffer circuit, sampling circuit, signal amplification circuit, etc.) with a pixel matrix circuit on the same substrate is explained.

A CMOS circuit was taken as an example and explained in embodiment 1, but in embodiment 16 a driver circuit with CMOS circuits as basic units, and a pixel matrix circuit with an NTFT as a pixel TFT, are formed on the same substrate. Note that a multiple gate structure such as a double gate structure or a triple gate structure may also be used for the pixel TFT.

Note that a structure can be taken in which a pixel electrode is formed to electrically connect the drain wiring, after the pixel TFT on which the source wiring and the drain wiring are formed in accordance with the processes of embodiment 1. The NTFT structure of the present invention has special features, but since it is easy to apply this to a pixel TFT by a known technique, this explanation is omitted.

Figure 12:
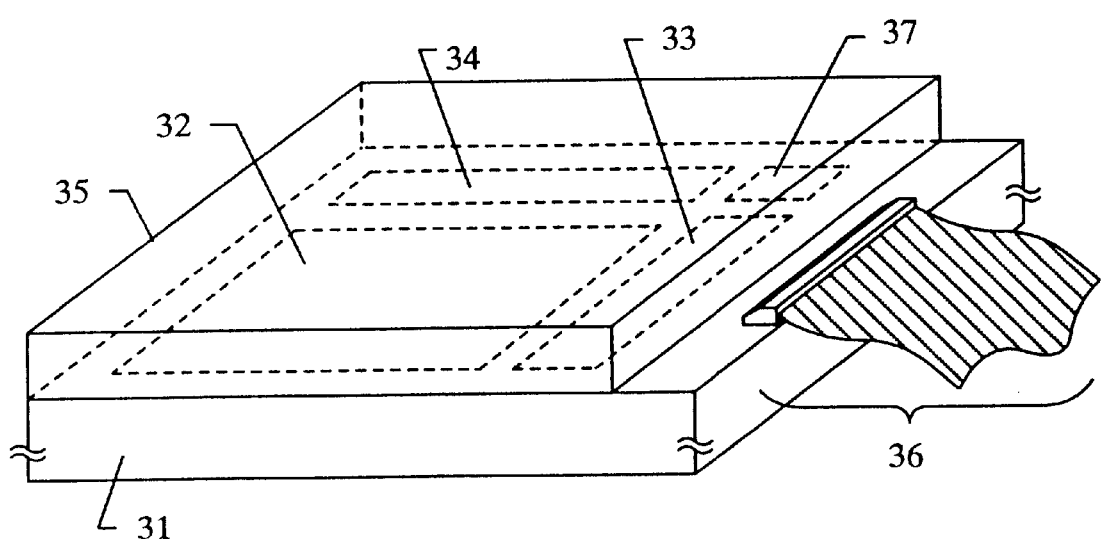
FIG. 12 is a drawing showing the external appearance of an electro-optical device of Embodiment 16.

When a driver circuit and a pixel matrix circuit are formed on the same substrate, thereby forming an orientation layer leads to a substantial completion of the TFT forming side of the substrate (active matrix substrate). Then, if an opposing substrate is prepared with an opposing electrode and an orientation layer, and if a liquid crystal material is injected into the space between the active matrix substrate and the opposing substrate, an active matrix type liquid crystal display device (also called liquid crystal display panel or liquid crystal module) with the structure shown in FIG. 12 is completed. An explanation of the liquid crystal injection process is omitted here because a known cell construction process may be used therefor.

Note that in FIG. 12 reference numeral 31 denotes a substrate with an insulating surface, 32 denotes a pixel matrix circuit, 33 denotes a source driver circuit, 34 denotes a gate driver circuit, 35 denotes an opposing substrate, 36 denotes an FPC (flexible printed circuit), and 37 denotes a signal processing circuit such as a D/A converter or a γ compensation circuit. Note that an IC chip is used to form a complex signal processing circuit, and the IC chip may be mounted on the substrate as is the case of COG.

In addition, a liquid crystal display device is given as an example and explained in embodiment 16, but provided that it is an active matrix type display device, embodiment 16 can be applied to an EL (electro-luminescence) display panel, an EC (electro-chromatic) display panel, an image sensor, and other electro-optical devices.

Further, the electro-optical devices of embodiment 16can be realized by using a structure in combination with any of embodiments 1 to 15.

[Embodiment 17]

It is possible to apply the TFT structure of the present invention to all semiconductor circuits, not just the electro-optical display devices shown in embodiment 16. Namely, it may be applied to microprocessors such RISC processors or ASIC processors, and may be applied in a range from signal processing circuits such as a D/A converter, etc., to the high frequency circuits used in portable devices (portable telephones, PHS, mobile computers).

In addition, it is possible to realize a three-dimensional structure semiconductor device in which a semiconductor circuit using the present invention is formed on an interlayer insulating film, which itself has been formed on a conventional MOSFET. It is possible to apply the present invention to all semiconductor devices that currently use LSIs in this way. Namely, the present invention may be applied to SOI structures (TFT structures that use a single crystal semiconductor thin film) such as SIMOX, Smart-cut (a registered trademark of SOITEC Corporation), ELTRAN (a registered trademark of Canon K.K.), etc.

Further, the semiconductor circuits of embodiment 17 can be realized by using a structure in combination with any of embodiments 1 to 15.

[Embodiment 18]

A TFT formed by implementing the present invention can be applied to various electro-optical devices (embodiment 16) and semiconductor circuits (embodiment 17). Namely, it is possible to use the present invention in all electronic equipments in which electro-optical devices or semiconductor circuits are incorporated as parts.

The following can be given electronic equipments: video cameras; digital cameras; projectors; projection televisions; displays used for personal computers; displays used for televisions; head mount displays (also called goggle type displays); car navigation systems; image reproduction devices (DVD players, CD players, MD players, etc.); portable information terminals (such as mobile computers, portable telephones, electronic books), etc. Some examples of these are shown in FIGS. 13A to 13D, FIGS. 23A to 23D, and FIGS. 24A to 24D.

FIG. 13A is a portable telephone, and is composed of a main body 2001, a sound output section 2002, a sound input section 2003, a display device 2004, operation switches 2005, and an antenna 2006. The present invention can be applied to the sound output section 2002, the sound input section 2003, the display device 2004, and to other signal control circuits.

FIG. 13B is a video camera, and is composed of a main body 2101, a display device 2102, a sound input section 2103, operation switches 2104, a battery 2105, and an image receiving section 2106. The present invention can be applied to the display device 2102, the sound input section 2103, and to other signal control circuits.

FIG. 13C is a mobile computer, and is composed of a main body 2201, a camera section 2202, an image receiving section 2203, operating switches 2204, and a display device 2205. The present invention can be applied to the display device 2205, and to other signal control circuits.

FIG. 13D is a goggle type display, and is composed of a main body 2301, a display device 2302, and an arm section 2303. The present invention can be applied to the display device 2302, and to other signal control circuits.

Figure 23A:
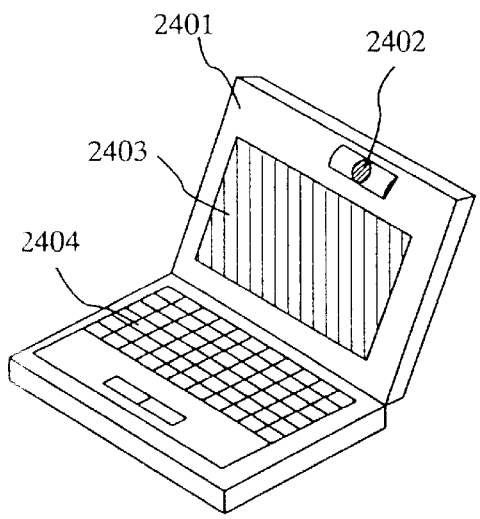
FIGS. 23A to 23D are drawings showing electronic equipments of Embodiment 18.

FIG. 23A is a personal computer, and is composed of a main body 2401, an image input section 2402, a display device 2403, and a keyboard 2404.

Figure 23B:
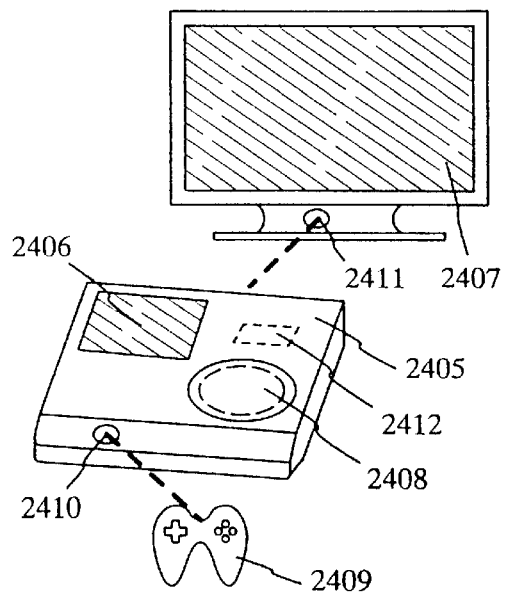

FIG. 23B is electronic game equipment such as a television game or a video game, and is composed of: a main body 2405 loaded with a recording medium 2408 and with electric circuits 2412 containing a CPU, etc.; a controller 2409; a display device 2407; and a display device 2406 incorporated into the main body 2405. The display device 2407 and the display device 2406 incorporated into the main body 2405 may both display the same information, or the former may be taken as the main display and the latter may be taken as the sub display to display information from the recording medium 2408, the equipment operation status, or touch sensors can be added for use as a control panel. Further, in order for the main body 2405, the controller 2409, and the display device 2407 to communicate with each other, hard wired communication may be used, or sensor sections 2410 and 2411 can be provided for either wireless communication or optical communication. The present invention can be used in the manufacture of the display devices 2406 and 2407. In addition, a conventional CRT can be used for the display device 2407. The present invention can be effectively applied, if the display device 2407 is a 24 to 45 inch liquid crystal television.

Figure 23C:
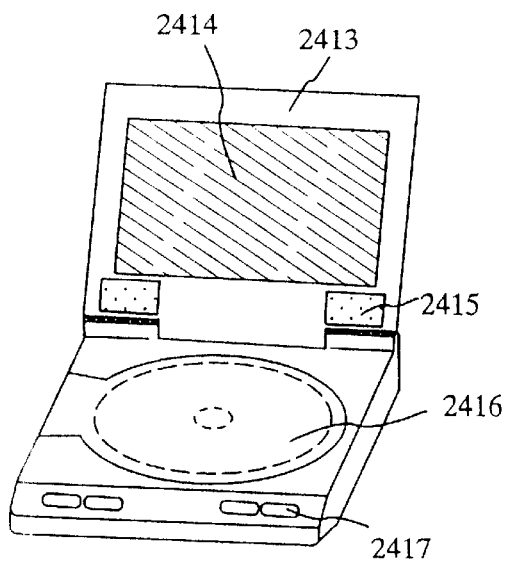

FIG. 23C is a player which uses a recording medium on which a program is recorded (hereafter referred to simply as a recording medium), and is composed of a main body 2413, a display device 2414, a speaker section 2415, a recording medium 2416, and operation switches 2417. Note that a DVD (digital versatile disk), or CD as a recording medium for this device, and that it can be used for music appreciation, film appreciation, games, and the Internet. The present invention can be applied to the display device 2414, and to other signal control circuits.

Figure 23D:
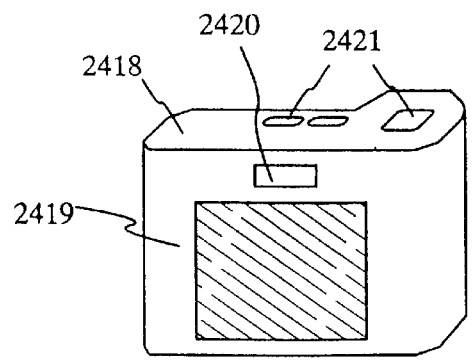

FIG. 23D is a digital camera, and is composed of a main body 2418, a display device 2419, an eyepiece section 2420, operation switches 2421, and an image receiving section (not shown). The present invention can be applied to the display device 2419, and to other signal control circuits.

Figure 24A:
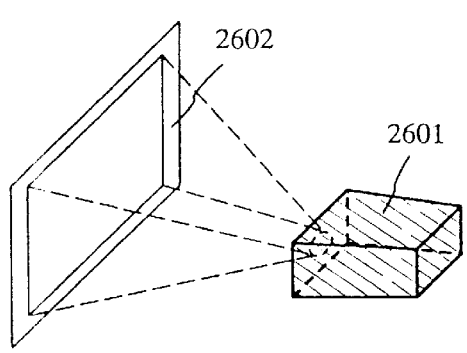
FIGS. 24A to 24D are drawings showing electronic equipments of Embodiment 18.

FIG. 24A is a front type projector, and is composed of a display device 2601, and a screen 2602. The present invention can be applied to the display device 2601, and to other signal control circuits.

Figure 24B:
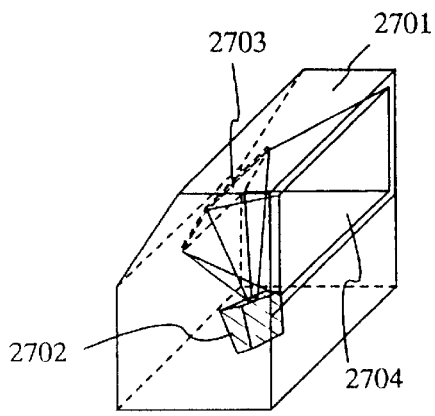

FIG. 24B is a rear type projector, and is composed of a main body 2701, a display device 2702, a mirror 2703, and a screen 2704. The present invention may be applied to the display device 2702 (it is especially effective for 50 to 100 inch cases), and to other signal control circuits.

Figure 24C:
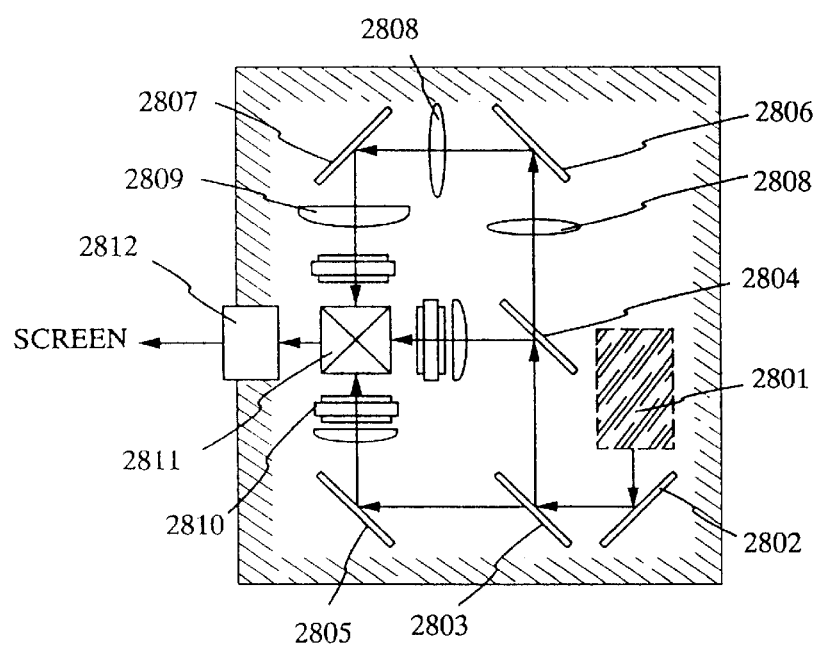

FIG. 24C is a drawing showing one example of the structure of the display devices 2601 and 2702 from FIGS. 24A and 24B. The display devices 2601 and 2702 consist of an optical light source system 2801, mirrors 2802 and 2805 to 2807, dichroic mirrors 2803 and 2804, optical lenses 2808 and 2809, a liquid crystal display device 2810, a prism 2811, and an optical projection system 2812. The optical projection system 2812 is composed of an optical system provided with a projection lens. Embodiment 18 shows an example in which the liquid crystal display device 2810 is triple stage using three lenses, but there are no special limits and a simple stage is acceptable, for example. Further, the operator may set optical systems such as optical lenses, polarizing film, film to regulate the phase difference, IR films, etc., suitably within the optical path shown by an arrow in FIG. 24C.

Figure 24D:
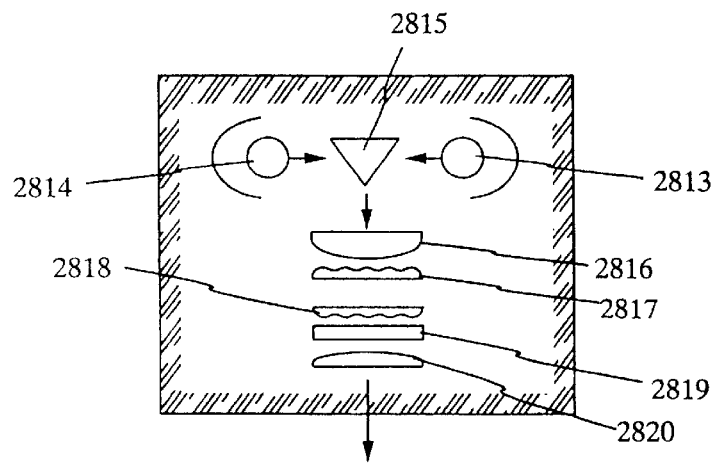

In addition, FIG. 24D shows one example of the structure of the optical light source system 2801 in FIG. 24C. In embodiment 18 the optical light source system 2801 is composed of light sources 2813 and 2814, a compound prism 2815, collimator lenses 2816 and 2820, lens arrays 2817 and 2818, and a polarizing conversion element 2819. Note that the optical light source system shown in FIG. 24D uses two light sources, but three, four, or more light sources, may be used. Of course a single light source is acceptable. Further, the operator may set optical lenses, polarizing film, film to regulate the phase difference, IR films, etc., suitably in the optical system.

As described above, an applicable range of the present invention is extremely wide, and it can be applied to electronic equipment in all fields. Further, the electronic equipments of embodiment 18 can be realized by using a structure in combination with any of embodiments 1 to 17.

[Embodiment 19]

FIGS. 21A to 21E are used to explain the manufacturing process of a CMOS circuit with a different structure from the one in embodiment 1. Note that the processing is nearly the same as in embodiment 1 until an intermediate step, so only the difference is explained.

First, processing is performed in accordance with embodiment 1 until it reaches the processes of FIG. 3D. However, the technique of Japanese Patent Application Laid-open No. Hei 7-130652 is used in embodiment 1 during formation of the active layers 303 and 304, while in embodiment 19 a crystallization example that does not use a catalytic element is shown.

In embodiment 19, after a 50 nm thick amorphous silicon film is formed by CVD or sputtering, it is crystallized by irradiation of light from an excimer laser, with KrF as the excitation gas. Of course an excimer laser using XeCl as the excitation gas, and the third or fourth harmonic component of a Nd:YAG laser may also be used. In addition, throughput can be effectively increased by setting the laser light cross section to a linear one.

Note that a polysilicon film is obtained by laser crystallization of an initial film as an amorphous silicon film in embodiment 19, but it is also acceptable to use a microcrystalline silicon film as the initial film, and to directly deposit a polysilicon film. Of course laser annealing may be performed on a deposited polysilicon film.

Further, furnace annealing may be substituted for laser annealing. Namely, crystallization may be carried out by annealing in an electric furnace at about 600° C.

An amorphous film is crystallized by generation of a natural nucleus in embodiment 19, and the polysilicon film formed in this way is then used to form the active layers 303 and 304. Other processes are performed in accordance with embodiment 1, and the state in FIG. 3D is then obtained.

Figure 21A:
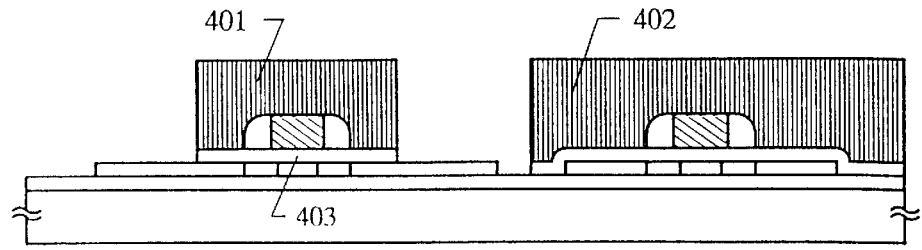
FIGS. 21A to 21E are drawings showing the manufacturing step of the CMOS circuit of Embodiment 19.
Figure 21B:
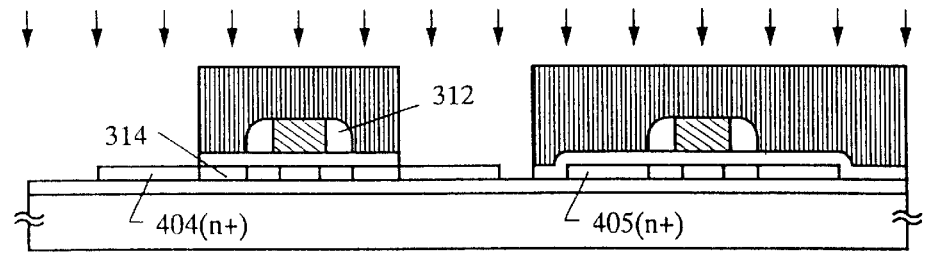

Next, a resist mask 401 that covers a portion of the NTFT, and a resist mask 402 that covers all of the PTFT, are formed as shown in FIG. 21A. Then the gate insulating film 305 shown in FIG. 3A is dry etched in this state, forming the gate insulating film 403.

At this point the length of the portion of the gate insulating film 403 that protrudes outward beyond the sidewall 312 (the length of the portion of the gate insulating film 403 that contacts the second impurity region 314) determines by the length (width) of the second impurity region 104, as shown in FIG. 1. Therefore, it is necessary to precisely perform the mask alignment of the resist mask 316.

A third phosphorous doping process is performed after obtaining the state in FIG. 21A. This time the acceleration voltage is set low at 10 KeV because phosphorous is doped into an exposed active layer. Note that the dose is regulated to obtain a phosphorous concentration of $5 \times 10^{20}$ atoms/cm$^3$ contained in a third impurity region 404 formed in this way. The phosphorous concentration at this time is denoted (n$^+$). (See FIG. 21B.)

Phosphorous is not doped into the area shielded by the resist mask 401 in this process, so the second impurity region 314 remains as is in that area. Therefore the second impurity region 104 shown in FIG. 1 is defined here. At the same time, the third impurity region 105 shown in FIG. 1 is defined.

The second impurity region 314 functions as a 2nd LDD region, and the third impurity region 404 functions as a source region or a drain region.

Next, the resist masks 401 and 402 are removed, and a resist mask 406 that newly covers all of the NTFT is formed. Then the sidewall 313 is removed, and in addition a gate insulating film 407 is formed by dry etching the gate insulating film 305 into the same shape as the gate insulating film 307. (See FIG. 21C.)

Figure 21C:
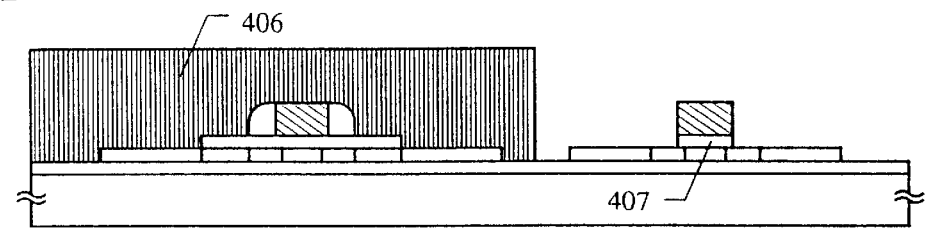

A boron doping process is performed after obtaining the state in FIG. 21C. The acceleration voltage is set to 10 KeV here, and the dose is regulated to obtain a boron concentration of $3 \times 10^{20}$ atoms/cm$^3$ contained in a fourth impurity region 408 formed in this way. The boron concentration at this time is denoted (p$^{++}$). (See FIG. 21D.)

At this time, the channel forming region 311 is formed on the inside of the gate wiring 307 because boron also wraps around and is doped on the inside of the gate wiring 307. Further, the first impurity region 309 and the second impurity region 315 formed on the PTFT side are inverted into p-type by boron in this process. Therefore, the resistance values in what were originally the first impurity region and the second impurity region change, but this is not a problem because boron is doped into a sufficiently high concentration.

This defines the fourth impurity region 110 shown in FIG. 1. The fourth impurity region 408 is formed in a completely self-aligning manner by using the gate wiring 307 as a mask, and functions as a source region or a drain region. Neither LDD region nor offset region is formed on the PTFT in embodiment 19, but this is no problem because PTFTs inherently have high reliability, and on the contrary, by not forming an LDD region, the on current can be gained, so there are cases when this is convenient.

Figure 21D:
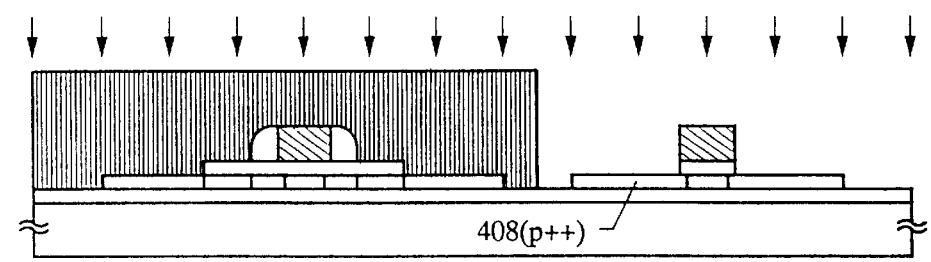

This leads finally to an NTFT active layer in which a channel forming region, a first impurity region, a second impurity region, and a third impurity region are formed, and to a PTFT active layer in which a channel forming region and a fourth impurity region are formed, as shown in FIG. 21D.

After obtaining the state in FIG. 21D, a first insulating film 409 is formed to a thickness of 1 $\mu$m. A silicon oxide film, a silicon nitride film, an oxide silicon nitride film (an insulating film expressed by SiOxNy), an organic resin film, or a laminate of these films can be used as the first insulating film 409. An acrylic resin film is employed in embodiment 19.

Source wirings 410 and 411, and a drain wiring 412 are formed of metallic materials after the first insulating film 409 is formed. A three layer laminate wiring of an aluminum film which contains titanium, sandwiched between titanium films, is used in embodiment 19.

Further, if a so-called BCB (benzocyclobutane) resin film is used for the first insulating film 409, then the flatness is increased and at the same time it becomes possible to use copper for a wiring material. Copper is extremely effective as a wiring material because the wiring resistance is low.

A silicon nitride film 413 is formed as a passivation film to a thickness of 50 nm after the source wiring and the drain wiring are formed. In addition a second interlayer insulating film 414 is formed thereon as a protective film. It is possible to use the same materials for the second interlayer insulating film 414 as those given above for the first insulating film 409. A laminate structure of an acrylic resin film on a 50 nm thick silicon oxide film is employed in embodiment 19.

Figure 21E:
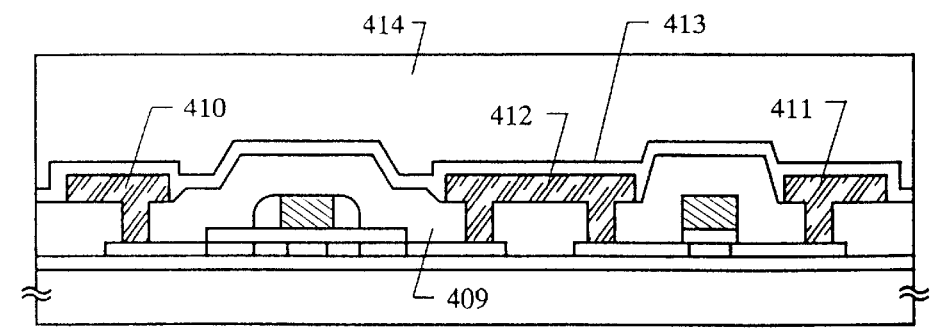

A CMOS circuit with a structure as shown in FIG. 21E can be completed by following the above processes. The CMOS circuit formed in accordance with embodiment 19 has a remarkably improved reliability for the entire circuit because the NTFT possesses outstanding reliability. Further, using a structure of embodiment 19, the balance of characteristics (the balance of electrical characteristics) between the NTFT and the PTFT becomes good, so it becomes difficult to cause malfunction.

Note that it is possible to freely combine embodiment 19 with the structure of any of embodiments 2, 3, and 9 to 15. Embodiment 19 is also applicable to the structure of any of embodiments 16 to 18.

[Embodiment 20]

This embodiment demonstrates a process for producing an EL (electroluminescence) display device according to the invention of the present application.

Figure 25A:
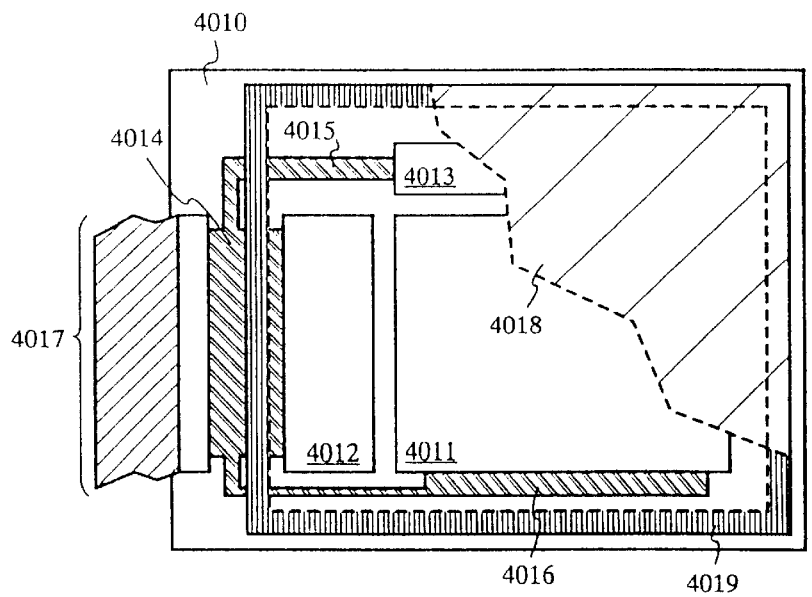
FIG. 25 is a drawing showing the outline of an EL display panel of Embodiment 20.

FIG. 25A is a top view showing an EL display device which was produced according to the invention of the present application. In FIG. 25A, there are shown a substrate 4010, a pixel portion 4011, a source side driving circuit 4012, a gate side driving circuit 4013, each driving circuit connecting to wirings 4014–4016 which reach FPC 4017 leading to external equipment.

The pixel portion, preferably together with the driving circuit, is enclosed by a sealing material (or housing material) 4018. The sealing material 4018 may be a concave metal plate or glass plate which encloses the element; alternatively, it may be an ultraviolet curable resin. A concave metal plate should be fixed to the substrate 4010 with an adhesive 4019 so that an airtight space is formed between the metal plate and the substrate 4010. Thus, the EL element is completely sealed in the airtight space and completely isolated from the outside air.

It is desirable that the cavity 4020 between the sealing material 4018 and the substrate 4010 be filled with an inert gas (such as argon, helium, and nitrogen) or a desiccant (such as barium oxide), so as to protect the EL element from degradation by moisture.

Figure 25B:
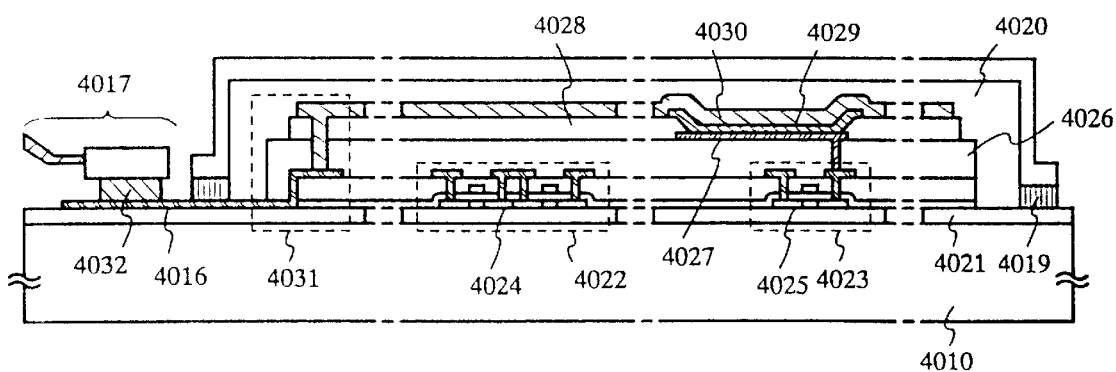

FIG. 25B is a sectional view showing the structure of the EL display device in this embodiment. There is shown a substrate 4010, an underlying coating 4021, a TFT 4022 or the driving circuit, and a TFT 4023 for the pixel portion. (The TFT 4022 shown is a CMOS circuit consisting of an n-channel type TFT and a p-channel type TFT. The TFT 4023 shown is the one which controls current to the EL element.) As a TFT 4022 fir the driving circuit, the NTFT and PTFT shown in FIG. 1 can be employed. As a TFT 4023 for the pixel portion, an NTFT or a PTFT can be employed.

Upon completion of TFT 4022 (for the driving circuit) and TFT 4023 (for the pixel portion), a pixel electrode 4027 is formed on the interlayer insulating film (a leveling film) 4026 made of a resin. This pixel electrode is a transparent conductive film which is electrically connected to the drain of TFT 4023 for the pixel portion. The transparent conductive film may be formed from a compound (called ITO) of indium oxide and tin oxide or a compound of indium oxide and zinc oxide. An insulating film 4028 is formed on the pixel electrode 4027, and an opening is formed above the pixel electrode 4027.

Subsequently, the EL layer 4029 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this embodiment, the EL layer is formed by vapor deposition through a shadow mask. The resulting EL layer permits each pixel to emit light differing in wavelength (red emitting layer, green emitting layer, and blue emitting layer). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without being exposed to air into it. In this Embodiment, the desired film was formed by using a film-forming apparatus of multi-chamber system (cluster tool system).

The multi-layer structure composed of lithium fluoride film and aluminum film is used in this Embodiment as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

The wiring 4016 is electrically connected to FPC 4017 through the gap (filled with an adhesive 4019) between the sealing material 4018 and the substrate 4010. As in the wiring 4016 explained above, other wirings 4014 and 4015 are also electrically connected to FPC 4017 under the sealing material 18.

Figure 26:
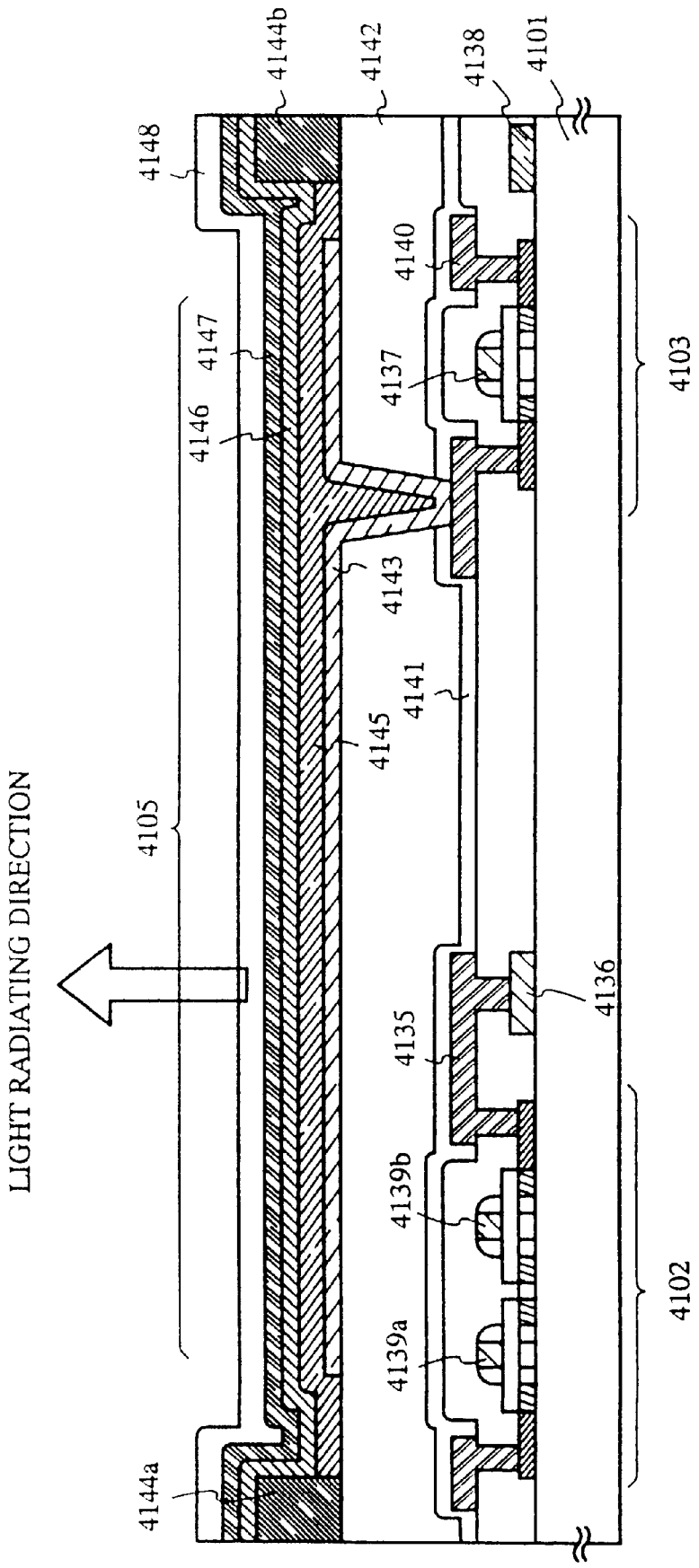
FIG. 26 is a drawing showing the cross section of the pixel portion in the EL display panel of Embodiment 20.
Figure 27A:
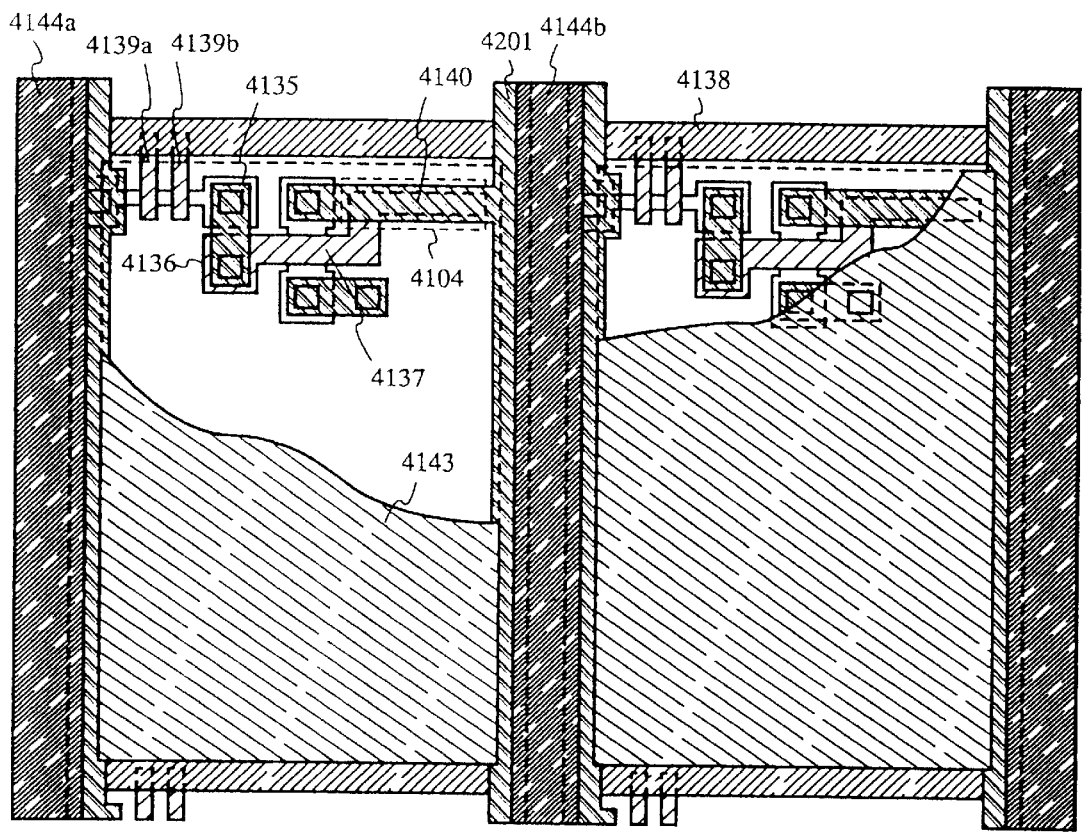
FIGS. 27A–27B are drawings showing the top view of the pixel portion in the EL display panel and the circuit structure for the pixel region, respectively of Embodiment 20.
Figure 27B:
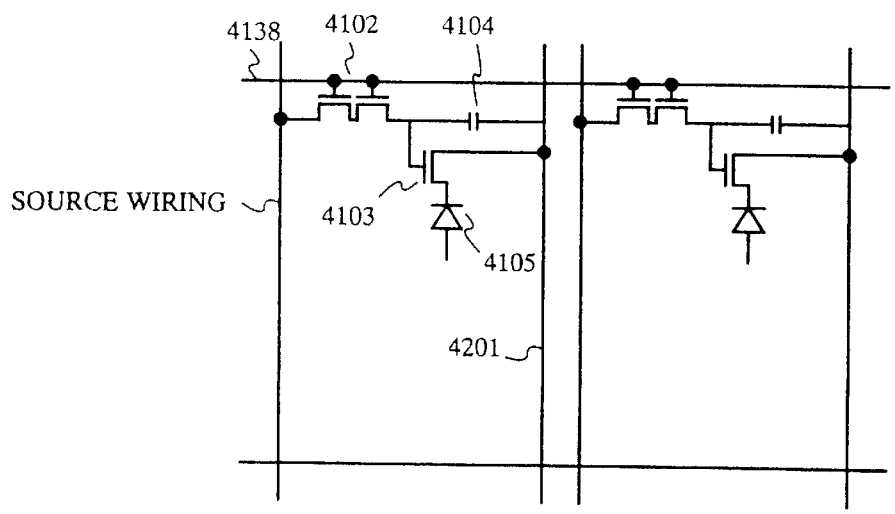

The invention can apply to the EL display panel having the constitution as above. The structure of the pixel region in the panel is illustrated in more detail. FIG. 26 shows the cross section of the pixel region; FIG. 27A shows the top view thereof; and FIG. 27B shows the circuit structure for the pixel portion. In FIG. 26, FIG. 27A and FIG. 27B, the same reference numerals are referred to for the same parts, as being common thereto.

In FIG. 26, the switching TFT 4102 formed on the substrate 4101 is an NTFT of the invention. In this Embodiment, it has a double-gate structure, but its structure and fabrication process do not so much differ from the structures and the fabrication processes illustrated herein above, and their description is omitted herein. However, the double-gate structure of the switching TFT 4102 has substantially two TFTs as connected in series, and therefore has the advantage of reducing the off-current to pass therethrough. In this Embodiment, the switching TFT 4102 has such a double-gate structure, but is not limitative. It may have a single-gate structure or a triple-gate structure, or even any other multi-gate structure having more than three gates. As the case may be, the switching TFT 4102 may be a PTFT of the invention.

The current-control TFT 4103 is an NTFT of the invention. The drain wiring 4135 in the switching TFT 4102 is electrically connected with the gate electrode 4137 in the current-control TFT, via the wiring 4136 therebetween. The wiring indicated by 4138 is a gate wiring for electrically connecting the gate electrodes 4139a and 4139b in the switching TFT 4102

It is very important that the current-control TFT 4103 has the structure defined in the invention. The current-control TFT is an element for controlling the quantity of current that passes through the EL device. Therefore, a large quantity of current passes through it, and the current-control TFT has a high risk of thermal degradation and degradation with hot carriers. Therefore, the structure of the invention is extremely favorable, in which an LDD region is so constructed that the gate electrode (strictly, the side wall functioning as the gate electrode) overlaps with the drain region in the current-control TFT, through a gate insulating film therebetween.

In this Embodiment, the current-control TFT 4103 is illustrated to have a single-gate structure, but it may have a multi-gate structure with a plurality of TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 27A, the wiring to be the gate electrode 4137 in the current-control TFT 4103 overlaps with the drain wiring 4140 therein in the region indicated by 4104, via an insulating film therebetween. In this state, the region indicated by 4104 form a capacitor. The capacitor 4104 functions to retain the voltage applied to the gate in the current-control TFT 4103. The drain wiring 4140 is connected with the current supply line (power line) 4201, from which a constant voltage is all the time applied to the drain wiring 4140.

On the switching TFT 4102 and the current-control TFT 4103, formed is a first passivation film 4141. On the film 4141, formed is a leveling film 4142 of an insulating resin. It is extremely important that the difference in level of the layered parts in TFT is removed through planarization with the leveling film 4142. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the leveled surface.

The reference numeral 4143 indicates a pixel electrode (a cathode in the EL device) of a conductive film with high reflectivity. The pixel electrode 4143 is electrically connected with the drain region in the current-control TFT 4103 It is preferable that the pixel electrode 4143 is of a low-resistance conductive film of an aluminum alloy, a copper alloy or a silver alloy, or of a laminate of those films. Needless-to-say, the pixel electrode 4143 may have a laminate structure with any other conductive films.

In the recess (this corresponds to the pixel) formed between the banks 4144a and 4144b of an insulating film (preferably of a resin), the light-emitting layer 4145 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 10-92576. Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the EL layer (a layer for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 4146 of PEDOT (polythiophene) or PAni (polyaniline) is formed on the light-emitting layer 4145 to give a laminate structure for the EL layer. On the hole injection layer 4146, formed is an anode 4147 of a transparent conductive film. In this Embodiment, the light having been emitted by the light-emitting layer 4145 radiates therefrom in the direction toward the top surface (that is, in the upward direction of TEFT). Therefore, in this, the anode must transmit light. For the transparent conductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent conductive film for the anode is of a material capable of being formed into a film at as low as possible temperatures.

When the anode 4147 is formed, the EL device 4105 is finished. The EL device 4105 thus fabricated herein indicates a capacitor comprising the pixel electrode (cathode) 4143, the light-emitting layer 4145, the hole injection layer 4146 and the anode 4147. As in FIG. 27A, the region of the pixel electrode 4143 is nearly the same as the area of the pixel. Therefore, in this, the entire pixel portion functions as the EL device. Accordingly, the light utility efficiency of the EL device fabricated herein is high, and the device can display bright images.

In this Embodiment, a second passivation film 4148 is formed on the anode 4147. For the second passivation film 4148, preferably used is a silicon nitride film or a silicon oxynitride film. The object of the second passivation film 4148 is to insulate the EL device from the outward environment. The second passivation film 4148 has the function of preventing the organic EL material from being degraded through oxidation and has the function of preventing it from degassing. With the second passivation film 4148 of that type, the reliability of the EL display device is improved.

As described herein above, the EL display panel of the invention fabricated in this Embodiment has a pixel portion for the pixel portion having the constitution as in FIG. 26, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 2 to 13, 15 or 19 in any desired manner. Incorporating the EL display panel of this Embodiment into the electronic appliance of Embodiment 18 as its display part is advantageous.

[Embodiment 21]

This Embodiment is to demonstrate a modification of the EL display panel of Embodiment 20, in which the EL device 4105 in the pixel portion has a reversed structure. For this Embodiment, referred to is FIG. 28. The constitution of the EL display panel of this Embodiment differs from that illustrated in FIG. 27A only in the EL device part and the current-control TFT portion. Therefore, the description of the other portions except those different portions is omitted herein.

Figure 28:
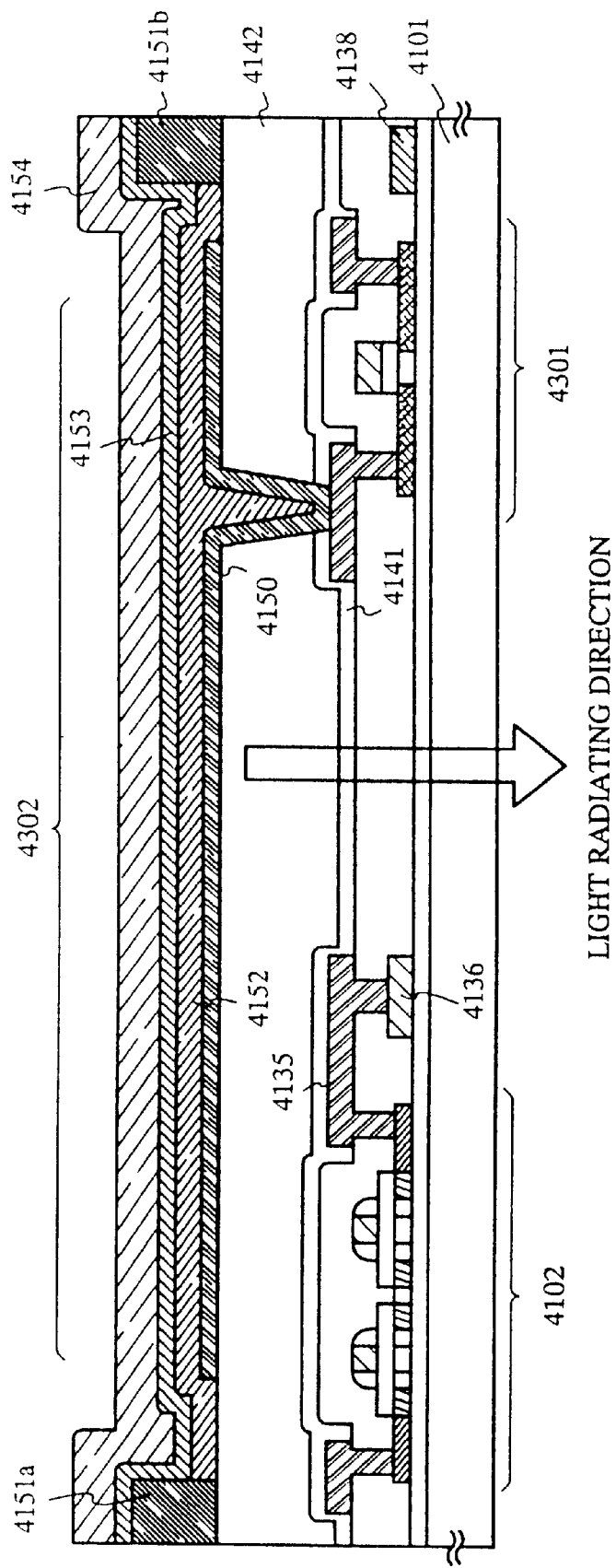
FIG. 28 is a drawing showing the cross section of the pixel portion in an EL display panel of Embodiment 21.

In FIG. 28, the current-control TFT 4301 may be PTFT of the invention. For the process of forming it, referred to is that of Embodiment 1.

In this Embodiment, the pixel electrode (anode) 4150 is of a transparent conductive film. Concretely, used is a conductive film of a compound of indium oxide and zinc oxide. Needless-to-say, also usable is a conductive film of a compound of indium oxide and tin oxide.

After the banks 4151a and 4151b of an insulating film have been formed, a light-emitting layer 4152 of polyvinylcarbazole is formed between them in a solution coating method. On the light-emitting layer 4152, formed are an electron injection layer 4153 of acetylacetonate potassium, and a cathode 4154 of an aluminum alloy. In this case, the cathode 4154 serves also as a passivation film. Thus is fabricated the EL device 4302.

In this Embodiment, the light having been emitted by the light-emitting layer radiates in the direction toward the substrate with TFT formed thereon, as in the direction of the arrow illustrated. In the case of the constitution of this Embodiment, it is preferable that the current-control TFT 2601 is PTFT.

The constitution of this Embodiment can be combined with any constitution of Embodiments 2 to 13, 15 or 19 in any desired manner. Incorporating the EL display panel of this Embodiment into the electronic appliance of Embodiment 18 as its display part is advantageous.

[Embodiment 22]

This Embodiment is to demonstrate modifications of the pixel with the circuit structure of FIG. 27B. The modifications are as in FIG. 29A to FIG. 29C. In this Embodiment illustrated in those FIG. 29A to FIG. 29C, 5001 indicates the source wiring for the switching TFT 5002; 5003 indicates the gate wiring for the switching TFT 5002; 5004 indicates a current-control TFT; 5005 indicates a capacitor; 5006 and 5008 indicate current supply lines; and 5007 indicates an EL device.

Figure 29A:
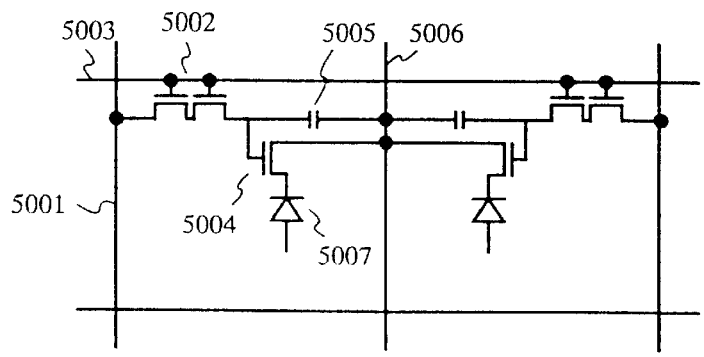
FIGS. 29A–29C are drawings showing different circuit structures for pixel portions in EL display panels of Embodiment 22.

In the embodiment of FIG. 29A, the current supply line 5006 is common to the two pixels. Specifically, this embodiment is characterized in that two pixels are lineal-symmetrically formed with the current supply line 5006 being the center between them. Since the number of current supply lines can be reduced therein, this embodiment is advantageous in that the pixel portion can be much finer and thinner.

Figure 29B:
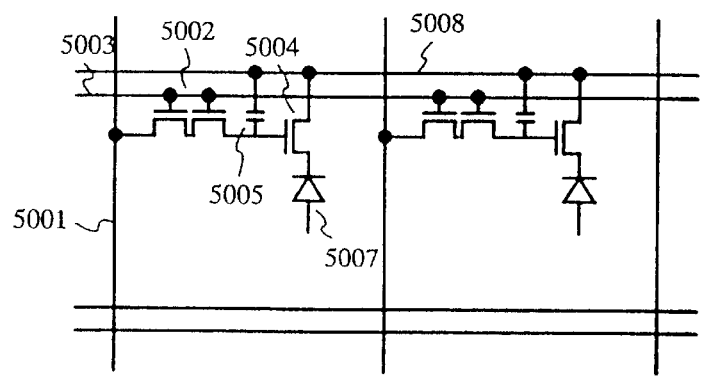

In the embodiment of FIG. 29B, the current supply line 5008 is formed in parallel to the gate wiring 5003. Specifically, in this, the current supply line 5008 is so constructed that it does not overlap with the gate wiring 5003, but is not limitative. Being different from the illustrated case, the two may overlap with each other via an insulating film therebetween so far as they are of different layers. Since the current supply line 5008 and the gate wiring 5003 may enjoy the common exclusive area therein, this embodiment is advantageous in that the pixel portion can be much finer and thinner.

Figure 29C:
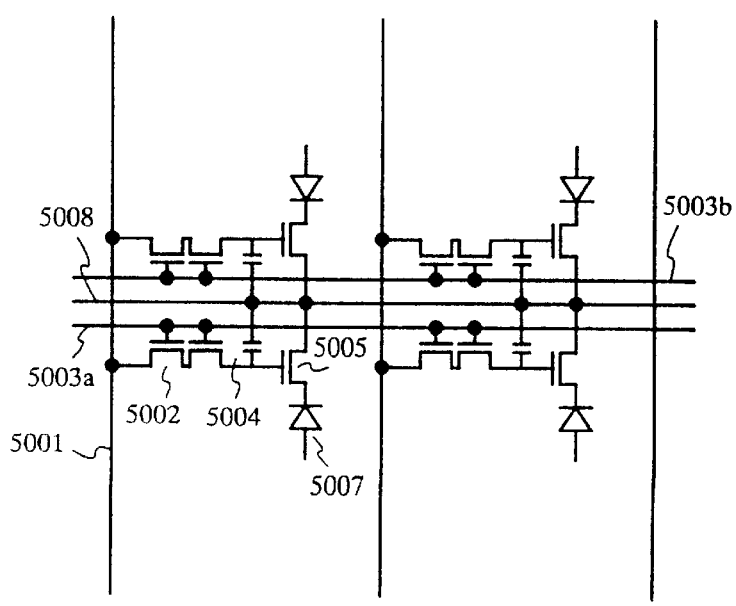

The structure of the embodiment of FIG. 29C is characterized in that the current supply line 5008 is formed in parallel to the gate wirings 5003, like in FIG. 29B, and that two pixels are lineal-symmetrically formed with the current supply line 5008 being the center between them. In this, it is also effective to provide the current supply line 5008 in such a manner that it overlaps with any one of the gate wirings 5003. Since the number of current supply lines can be reduced therein, this embodiment is advantageous in that the pixel pattern can be much finer and thinner.

The constitution of this Embodiment can be combined with any constitution of Embodiment 20 or 21 in any desired manner. Incorporating the EL display panel having the pixel portion of this Embodiment into the electronic equipments of Embodiment 18 as its display portion is advantageous.
[Embodiment 23]

The embodiment of Embodiment 20 illustrated in FIG. 27A and FIG. 27B is provided with the capacitor 4104 which acts to retain the voltage applied to the gate electrode in the current-control TFT 4103. In the embodiment, however, the capacitor 4104 may be omitted.

In the embodiment of Embodiment 20, the current-control TFT 4103 is NTFT of the invention, as in FIG. 26. Therefore, in the embodiment, the LDD region is so formed that it overlaps with the gate electrode (strictly, the side wall) through the gate insulating film therebetween. In the overlapped region, formed is a parasitic capacitance generally referred to as a gate capacitance. This Embodiment is characterized in that the parasitic capacitance is positively utilized in place of the capacitor 4104.

The parasitic capacitance varies, depending on the area in which the side wall overlaps with the LDD region, and is therefore determined according to the length of the LDD region in the overlapped area.

Also in the embodiments of Embodiment 22 illustrated in FIG. 29A, FIG. 29B and FIG. 29C, the capacitor 5005 can be omitted.

The constitution of this Embodiment can be combined with any constitution of Embodiment 20 or 21 in any desired manner. Incorporating the EL display panel having the pixel structure of this Embodiment into the electronic equipments of Embodiment 18 as its display part is advantageous.
[Embodiment 24]

Figure 30A:
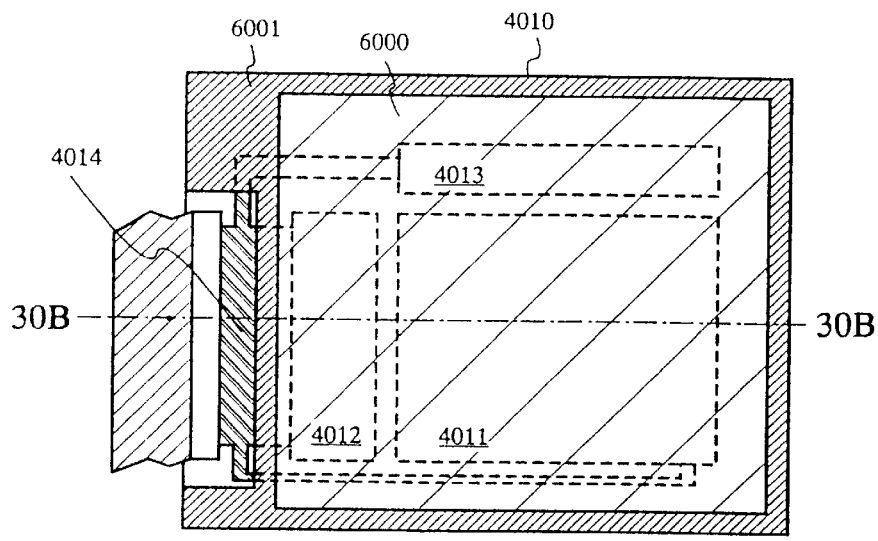
FIGS. 30A–30B is drawings showing the outline of an EL display panel of Embodiment 24.
Figure 30B:
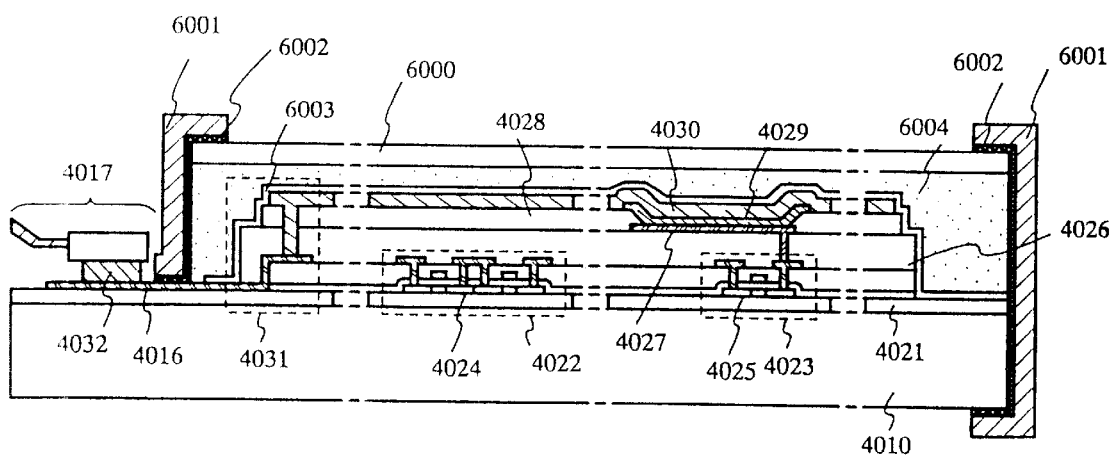

In Embodiment 24, another EL module is explained, as shown in FIGS. 30A and 30B. The same reference numerals in FIGS. 30A and 30B as in FIGS. 25–29C indicate same constitutive elements, so an explanation is omitted.

FIG. 30A shows a top view of the EL module in this embodiment and FIG. 30B shows a sectional view of A–A' of FIG. 30A. A filling material 6004, a covering material 6000, a sealing material 6002, a flame material 6001 and a passivation film 6003 are formed in the EL module.

According to Embodiment 20, a structure until a cathode 4030 of an EL element is fabricated. Further, a passivation film 6003 is formed to cover a surface of the EL element.

A filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture can be maintained.

As a covering material 6001, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 6004. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

[Embodiment 25]

Figure 31A:
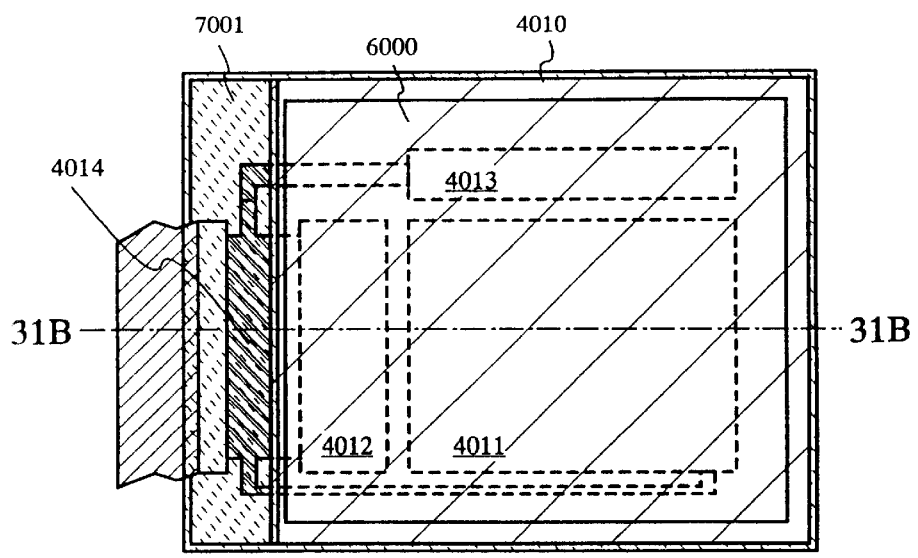
FIGS. 31A–31B is drawings showing the outline of an EL display panel of Embodiment 25.
Figure 31B:
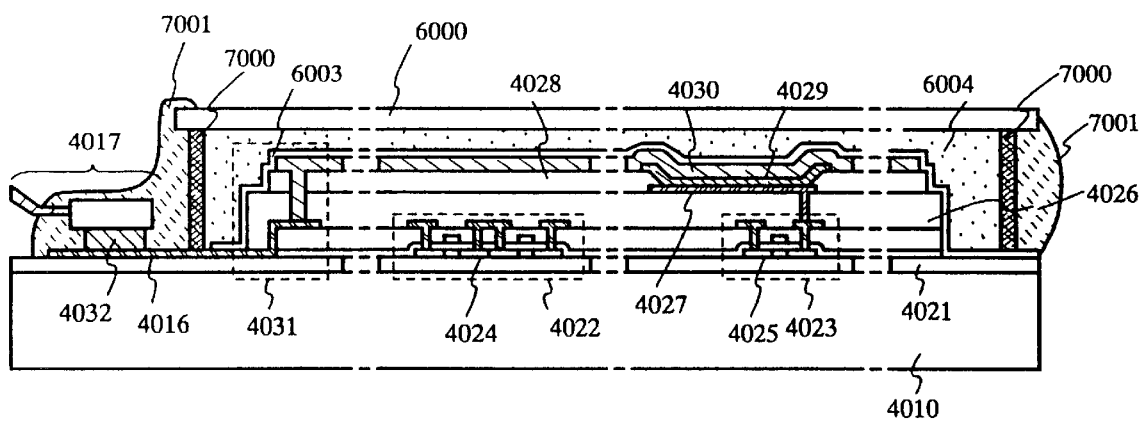

In Embodiment 25, a different EL module from Embodiments 20–24 is explained, as shown in FIGS. 31A and 31B. The same reference numerals in FIG. 31A and 31B as in FIGS. 25–30A indicate same constitutive elements, so an explanation is omitted.

FIG. 31A shows a top view of the EL module in this embodiment and FIG. 31B shows a sectional view of A–A' of FIG. 31A.

In Embodiment 25, only the difference between Embodiment 24 and the this embodiment is explained. After attaching a covering material 6000, a flame material 6001 is formed in Embodiment 24. On the other hand, as shown in FIG. 31B, a sealing material 7000 is formed to locate inside the substrate 4010 and the covering material 6000. Further, another sealing material 7000 covers outside thereof. The second sealing material 7001 also covers FPC 4017 to seal inside the EL element.

It is possible to raise the reliability of an NTFT by implementing the present invention. Therefore, it is possible to ensure the reliability of an NTFT having high electrical characteristics (especially high mobility) that are required for strict reliability. At the same time, by forming a CMOS circuit with an NTFT and a PTFT that have a superior balance of characteristic, a semiconductor circuit showing high reliability and outstanding electrical characteristics can be formed.

In addition, semiconductor devices having few instability factors can be realized because it is possible to reduce the catalytic element used to crystallize the semiconductor according to the present invention. Moreover, there is no reduction in throughput because the process that reduces the catalytic element is performed at the same time as the formation and activation of the source region and the drain region.

Furthermore, by raising the reliability of circuits constructed by TFTs, as above, it is possible to ensure the reliability of all semiconductor devices, including electro-optical devices, semiconductor circuits, and electronic equipments.

What is claimed is:

1. A semiconductor device comprising a thin film transistor including:

an active layer;

a wiring being formed over the active layer having an insulating film interposed therebetween; and at least a sidewall being formed on a side portion of the wiring, wherein the active layer has a channel forming region, at least a first impurity region, at least a second impurity region, and at least a third impurity region, wherein each of the first, second and third impurity regions has a same impurity at a different concentration, wherein the first impurity region is in contact with the channel region and overlap the sidewall through the insulating film.

2. A device according to claim 1, wherein a catalytic element being capable of crystallization of the active layer is included at a concentration in a range of $1 \times 10^{17}$ to $1 \times 10^{20}$ atoms/cm$^3$ in one of the first, second and third impurity regions which is farthest from the channel forming region.

3. A device according to claim 2, wherein the catalytic element comprises at least an element selected from a group consisting of Ni, Ge, Co, Fe, Pd, Sn, Pb, Pt, Cu, Au, and Si.

4. A device according to claim 1, wherein at least a portion of the wiring is covered by a silicon nitride film.

5. A device according to claim 1, wherein the sidewall includes silicon.

6. A device according to claim 1, wherein the semiconductor device is one selected from the group consisting of a RISC processor, an ASIC processor, a D/A converter, a portable telephone, a PHS, and a mobile computer.

7. A device according to claim 1, wherein the semiconductor device is one selected from the group consisting of a video-camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

8. A device according to claim 1, wherein the sidewall is conductive.

9. A semiconductor device comprising a thin film transistor including:
an active layer;
a wiring being over the active layer having an insulating film interposed therebetween; and
at least a sidewall being formed on a side portion of the wiring,
wherein the active layer has a channel forming region, at least a first impurity region, at least a second region and at least a third region, each of which being aligned in order,
wherein each of the first, second and third impurity regions has a same impurity at a different concentration,
wherein the first impurity region is in contact with the channel region and overlap the sidewall through the insulating film.

10. A device according to claim 9, wherein the insulating film is formed in contact with the channel forming region, the first impurity region, and the second impurity region.

11. A device according to claim 9, wherein the first impurity region includes the impurity at a first concentration of $1\times10^{15}$ to $1\times10^{17}$ atoms/cm$^3$, and the second impurity region includes the impurity at a second concentration of $1\times10^{16}$ to $1\times10^{19}$ atoms/cm$^3$.

12. A device according to claim 2, wherein a catalytic element being capable of crystallization of the active layer is included at a concentration in a range of $1\times10^{17}$ to $1\times10^{20}$ atoms/cm$^3$ in one of the first, second and third impurity regions which is farthest from the channel forming region.

13. A device according to claim 12 wherein the catalytic element comprises at least an element selected from a group consisting of Ni, Ge, Co, Fe, Pd, Sn, Pb, Pt, Cu, Au, and Si.

14. A device according to claim 9, wherein at least a portion of the wiring is covered by a silicon nitride film.

15. A device according to claim 9, wherein the sidewall includes silicon.

16. A device according to claim 9, wherein the semiconductor device is one selected from the group consisting of a RISC processor, an ASIC processor, a D/A converter, a portable telephone, a PHS, and a mobile computer.

17. A device according to claim 9, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

18. A device according to claim 2, wherein the sidewall is conductive.

19. A semiconductor device comprising a thin film transistor having:
an active layer;
a wiring being formed over the active layer having an insulating film interposed therebetween, and
at least a sidewall being formed on a side portion of the wiring,
wherein the active layer has a channel forming region, at least a first impurity region, at least a second impurity region, and at least a third impurity region,
wherein each of the first, second and third impurity regions has a same impurity at a different concentration,
wherein concentrations of the impurity in the first, second and third impurity regions increase as distances from the channel forming region become longer.

20. A device according to claim 19, wherein a catalytic element being capable of crystallization of the active layer is included at a concentration in a range of $1\times10^{17}$ to $1\times10^{20}$ atoms/cm$^3$ in one of the first, second and third impurity regions which is farthest from the channel forming region.

21. A device according to claim 20, wherein the catalytic element comprises at least an element selected from a group consisting of Ni, Ge, Co, Fe, Pd, Sn, Pb, Pt, Cu, Au, and Si.

22. A device according to claim 19, wherein at least a portion of the wiring is covered by a silicon nitride film.

23. A device according to claim 19, wherein the sidewall includes silicon.

24. A device according to claim 19, wherein the semiconductor device is one selected from the group consisting of a RISC processor, an ASIC processor, a D/A converter, a portable telephone, a PHS, and a mobile computer.

25. A device according to claim 19, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

26. A device according to claim 19, wherein the sidewall is conductive and is overlapped with the one of the first, second and third impurity regions which is in contact with the channel forming region.

27. A semiconductor device comprising a thin film transistor having:
an active layer,
a wiring being formed over the active layer having an insulating film, and
at least a sidewall being formed on a side portion of said wiring,
wherein the active layer has a channel forming region, at least a first impurity region, at least a second region and at least a third region, each of which being aligned in order,
wherein each of the first, second and third impurity regions has a same impurity at a different concentration,
wherein the second impurity region includes the impurity at a higher concentration than the first impurity region while the third impurity region includes the impurity at a higher concentration than the second impurity region.

28. A device according to claim 27, wherein a catalytic element being capable of crystallization of the active layer is included at a concentration in a range of $1\times10^{17}$ to $1\times10^{20}$ atoms/cm$^3$ in one of the first, second and third impurity regions which is farthest from the channel forming region.

29. A device according to claim 28, wherein the catalytic element comprises at least an element selected from a group consisting of Ni, Ge, Co, Fe, Pd, Sn, Pb, Pt, Cu, Au, and Si.

30. A device according to claim 27, wherein at least a portion of the wiring is covered by a silicon nitride film.

31. A device according to claim 27, wherein the sidewall includes silicon.

32. A device according to claim 27, wherein the insulating film is formed in contact with the channel forming region, the first impurity region, and the second impurity region.

33. A device according to claim 27, wherein the first impurity region includes the impurity at a first concentration of $1\times10^{15}$ to $10\times^{17}$ atoms/cm$^3$, and the second impurity region includes the impurity at a second concentration of $1\times10^{16}$ to $1\times10^{19}$ atoms/cm$^3$.

34. A device according to claim 27, wherein the semiconductor device is one selected from the group consisting of a RISC processor, an ASIC processor, a D/A converter, a portable telephone, a PHS, and a mobile computer.

35. A device according to claim 27, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

36. A device according to claim 27, wherein the sidewall is conductive and is overlapped with the first impurity region.

37. A semiconductor device comprising a CMOS circuit including:
    an NTFT having:
        a first active layer,
        a first wiring being formed over the first active layer having a first insulating film interposed therebetween, and
        at least a sidewall being formed on a side portion of the first wiring, and
    a PTFT having:
        a second active layer, and
        a second wiring being formed over the second active layer having a second insulating film interposed therebetween,
    wherein the first active layer of the NTFT has a first channel forming region, at least a first impurity region, at least a second impurity region, and at least a third impurity region,
    wherein each of the first, second and third impurity regions has a same impurity at a different concentration,
    wherein the first impurity region is in contact with the first channel region and overlap the sidewall through the first insulating film.

38. A device according to claim 37, wherein a catalytic element being capable of crystallization of the first active layer is included at a concentration in a range of $1\times10^{17}$ to $1\times10^{20}$ atoms/cm$^3$ in one of the first, second and third impurity regions which is farthest from the first channel forming region.

39. A device according to claim 38, wherein the catalytic element comprises at least an element selected from a group consisting of Ni, Ge, Co, Fe, Pd, Sn, Pb, Pt, Cu, Au, and Si.

40. A device according to claim 37, wherein at least a portion of each of the first and second wirings is covered by a silicon nitride film.

41. A device according to claim 37, wherein the second active layer of the PTFT includes a second channel forming region and at least a fourth impurity region.

42. A device according to claim 37, wherein the sidewall includes silicon.

43. A device according to claim 37, wherein the semiconductor device is one selected from the group consisting of a RISC processor, an ASIC processor, a D/A converter, a portable telephone, a PHS, and a mobile computer.

44. A device according to claim 37, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

45. A device according to claim 37, wherein the sidewall is conductive.

46. A semiconductor device comprising a CMOS circuit including:
    an NTFT having:
        a first active layer,
        a first wiring being formed over the first active layer having a first insulating film interposed therebetween, and
        at least a sidewall being formed on a side portion of the first wiring, and
    a PTFT having:
        a second active layer, and
        a second wiring being formed over the second active layer having a second insulating film interposed therebetween,
    wherein the first active layer of the NTFT has a first channel forming region, at least a first impurity region, at least a second impurity region, and at least a third impurity region, each of which being aligned in order,
    wherein each of the first, second and third impurity regions has a same impurity at a different concentration,
    wherein the first impurity region is in contact with the first channel region and overlap the sidewall through the first insulating film.

47. A device according to claim 46, wherein the first insulating film is formed in contact with the first channel forming region, the first impurity region, and the second impurity region.

48. A device according to claim 46, wherein the first impurity region includes the impurity at a first concentration of $1\times10^{15}$ to $1\times10^{17}$ atoms/cm$^3$, and the second impurity region includes the impurity at a second concentration of $1\times10^{16}$ to $1\times10^{19}$ atoms/cm$^3$.

49. A device according to claim 46, wherein a catalytic element being capable of crystallization of the first active layer is included at a concentration in a range of $1\times10^{17}$ to $1\times10^{20}$ atoms/cm$^3$ in one of the first, second and third impurity regions which is farthest from the first channel forming region.

50. A device according to claim 49, wherein the catalytic element comprises at least an element selected from a group consisting of Ni, Ge, Co, Fe, Pd, Sn, Pb, Pt, Cu, Au, and Si.

51. A device according to claim 46, wherein at least a portion of each of the first and second wirings is covered by a silicon nitride film.

52. A device according to claim 46, wherein the second active layer of the PTFT includes a second channel forming region and at least a fourth impurity region.

53. A device according to claim 46, wherein the sidewall includes silicon.

54. A device according to claim 46, wherein the semiconductor device is one selected from the group consisting of a RISC processor, an ASIC processor, a D/A converter, a portable telephone, a PHS, and a mobile computer.

55. A device according to claim 46, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

56. A device according to claim 46, wherein the sidewall is conductive.

57. A semiconductor device comprising a CMOS circuit including:
   an NTFT having:
      a first active layer,
      a first wiring being formed over the first active layer having a first insulating film interposed therebetween, and
      at least a sidewall formed on a side portion of the first wiring, and
   a PTFT having:
      a second active layer, and
      a second wiring being formed over the second active layer having a second insulating film interposed therebetween,
   wherein the first active layer of the NTFT has a first channel forming region, at least a first impurity region, at least a second impurity region, and at least a third impurity region,
   wherein each of the first, second and third impurity regions has a same impurity,
   wherein concentrations of the impurity in the first, second and third impurity regions increase as distances from the channel forming region become longer.

58. A device according to claim 57, wherein a catalytic element being capable of crystallization of the first active layer is included at a concentration in a range of $1 \times 10^{17}$ to $1 \times 10^{20}$ atoms/cm$^3$ in one of the first, second and third impurity regions which is farthest from the first channel forming region.

59. A device according to claim 58, wherein the catalytic element comprises at least an element selected from a group consisting of Ni, Ge, Co, Fe, Pd, Sn, Pb, Pt, Cu, Au, and Si.

60. A device according to claim 57, wherein at least a portion of each of the first and second wirings is covered by a silicon nitride film.

61. A device according to claim 57, wherein the second active layer of the PTFT includes a second channel forming region and at least a fourth impurity region.

62. A device according to claim 57, wherein the sidewall includes silicon.

63. A device according to claim 57, wherein the semiconductor device is one selected from the group consisting of a RISC processor, an ASIC processor, a D/A converter, a portable telephone, a PHS, and a mobile computer.

64. A device according to claim 57, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

65. A device according to claim 57, wherein the sidewall is conductive and is overlapped with the one of the first, second and third impurity regions which is in contact with the channel forming region.

66. A semiconductor device comprising a CMOS circuit including:
   an NTFT having:
      a first active layer,
      a first wiring being formed over the first active layer having a first insulating film interposed therebetween, and
      at least a sidewall being formed on a side portion of the first wiring, and
   a PTFT having:
      a second active layer, and
      a second wiring being formed over the second active layer having a second insulating film interposed therebetween,
   wherein the first active layer of the NTFT has a first channel forming region, at least a first impurity region, at least a second impurity region, and at least a third impurity region, each of which being aligned in order,
   wherein each of the first, second and third impurity regions has a same impurity at a different concentration,
   wherein the second impurity region includes the impurity at a higher concentration than the first impurity region while the third impurity region includes the impurity at a higher concentration than the second impurity region.

67. A device according to claim 66, wherein a catalytic element being capable of crystallization of the first active layer is included at a concentration in a range of $1 \times 10^{17}$ to $1 \times 10^{20}$ atoms/cm$^3$ in one of the first, second and third impurity regions which is farthest from the first channel forming region.

68. A device according to claim 67, wherein the catalytic element comprises at least an element selected from a group consisting of Ni, Ge, Co, Fe, Pd, Sn, Pb, Pt, Cu, Au, and Si.

69. A device according to claim 66, wherein at least a portion of each of the first and second wirings is covered by a silicon nitride film.

70. A device according to claim 66, wherein the second active layer of the PTFT includes a second channel forming region and at least a fourth impurity region.

71. A device according to claim 66, wherein the sidewall includes silicon.

72. A device according to claim 66, wherein the first insulating film is formed in contact with the first channel forming region, the first impurity region, and the second impurity region.

73. A device according to claim 66, wherein the first impurity region includes the impurity at a first concentration of $1 \times 10^{15}$ to $1 \times 10^{17}$ atoms/cm$^3$, and the second impurity region includes the impurity at a second concentration of $1 \times 10^{16}$ to $1 \times 10^{19}$ atoms/cm$^3$.

74. A device according to claim 66, wherein the semiconductor device is one selected from the group consisting of a RISC processor, an ASIC processor, a D/A converter, a portable telephone, a PHS, and a mobile computer.

75. A device according to claim 66, wherein the semiconductor device is one selected from the group consisting of a video camera, a digital camera, a projector, a projection television, a display for a personal computer, a display for a television, a head mount display (a goggle type display), a car navigation system, a DVD player, a CD player, an MD players, a mobile computer, a portable telephone, and an electronic book.

76. A device according to claim 66, wherein the sidewall is conductive and is overlapped with the first impurity region.

77. An electroluminescence display device comprising:
  a pixel portion and a peripheral driving circuit portion over a substrate;
  at least a first thin film transistor for controlling a current and a second thin film transistor for switching each being formed in the pixel portion;
  at least a CMOS transistor being formed in the peripheral driving circuit portion;
  wherein the first thin film transistor includes:
    a semiconductor island over the substrate;
    a channel forming region in the semiconductor island;
    at least a first impurity region being in contact with the channel forming region;
    at least a second impurity region being in contact with the first impurity region;
    at least a third impurity region being in contact with the second impurity region;
    a gate insulating film being formed on the channel forming region, the first impunity region and the second impurity region;
    a gate electrode being formed over the channel forming region with the gate insulating film interposed therebetween;
    at least a sidewall being formed over the first impurity region and being conductive;
  a pixel electrode being electrically connected to the third impurity region of the first thin film transistor;
  a light emitting layer being formed over the pixel electrode;
  an electrode being formed over the light emitting layer.

78. A device according to claim 77, wherein the light emitting layer is an EL layer.

79. A device according to claim 77, wherein a drain region of the second thin film transistor is electrically connected to the gate electrode of the first thin film transistor.

80. A device according to claim 77, wherein the second thin film transistor has a multi-gate structure.

81. A device according to claim 77, wherein at least one of the pixel electrode and the electrode is transparent.

* * * * *